United States Patent
Inoue

(10) Patent No.: US 7,411,811 B2
(45) Date of Patent: Aug. 12, 2008

(54) SEMICONDUCTOR STORAGE DEVICE

(75) Inventor: Kohji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 184 days.

(21) Appl. No.: 11/505,411

(22) Filed: Aug. 17, 2006

(65) Prior Publication Data

US 2007/0041235 A1    Feb. 22, 2007

(30) Foreign Application Priority Data

Aug. 17, 2005    (JP) .............................. 2005-236285

(51) Int. Cl.
    *G11C 11/00*    (2006.01)
(52) U.S. Cl. ....................... 365/148; 365/100
(58) Field of Classification Search .................. 365/148, 365/100, 163
    See application file for complete search history.

(56) References Cited

U.S. PATENT DOCUMENTS

| | | | |
|---|---|---|---|
| 6,888,773 B2 * | 5/2005 | Morimoto ..................... | 365/218 |
| 7,061,790 B2 * | 6/2006 | Morimoto et al. ............ | 365/148 |
| 7,242,606 B2 * | 7/2007 | Hachino et al. .............. | 365/148 |
| 2004/0257864 A1 | 12/2004 | Tamai et al. | |
| 2006/0077737 A1 * | 4/2006 | Ooishi ........................ | 365/203 |

OTHER PUBLICATIONS

Y. Chen et al., An Access-Transistor-Free (OT/1R) Non-Volatile Resistance Random Access Memory (RRAM) Using a Novel Treshold Switching, Self-Rectifying Chalcogenide Device, IEEE, IEDM Technical Digest, Session 37.4, © 2003.

* cited by examiner

*Primary Examiner*—Anh Phung
(74) *Attorney, Agent, or Firm*—Nixon & Vanderhye, P.C.

(57) ABSTRACT

In a semiconductor storage device with cross point type arrays of memory cells including variable resistor elements, a selected data line and unselected data lines are supplied with a row selecting potential and a row unselecting potential through a data line selecting transistor respectively, a selected bit line and unselected bit lines are supplied with a column selecting potential and a column unselecting potential through a bit line selecting transistor respectively. Data lines and bit lines are separately driven so that when the data line selecting transistor is higher in the current driving capability than the bit line selecting transistor, a second bias voltage between the row unselecting potential and column selecting potential is lower than a first bias voltage between the row selecting potential and column unselecting potential, in the opposite case, the first bias voltage is lower than the second voltage.

9 Claims, 17 Drawing Sheets

US 7,411,811 B2

SEMICONDUCTOR STORAGE DEVICE

CROSS REFERENCE TO RELATED APPLICATION

This Nonprovisional application claims priority under 35 U.S.C. §119(a) on Patent Application No. 2005-236285 filed in Japan on Aug. 17, 2005, the entire contents of which are hereby incorporated by reference.

BACKGROUND OF THE INVENTION

1. Field of the Invention

The present invention relates to a semiconductor storage device which comprises an array of memory cells, each memory cell consisting mainly of a variable resistor element of which the electric resistance is varied to save a data, arranged in rows and columns at a cross point mode where each row of the memory cells are connected at one end to a common data line and each column of the memory cells are connected at the other end to a common bit line. Particularly, the present invention relates to a semiconductor storage device which comprises a memory cell array of a cross point type where each variable resistor element is varied in the resistance by application of electric pulses.

2. Description of the Related Art

As known (and disclosed, for example, in "An Access-Transistor-Free (0T/1R) Non-Volatile Resistance Random Access Memory (RRAM) Using a Novel Threshold Switching, Self-Rectifying Chalcogenide Device", by Y. Chen et al, IEDM Technical Digest, Session 37.4, 2003 which will be defined as Citation 1), semiconductor storage devices of a cross point type have been introduced where each memory cell in the memory cell array includes a storage device but not any selectable element and is connected to a data line (a selected row line) and a bit line (a selected column line) and will hence be referred to as a cross point memory hereinafter.

Such a known cross point memory has a variable resistor element located at the intersection (cross point) between a data line and a bit line in the memory cell array and connected at one of its lower and upper electrodes to the data line and at the other to the bit line thus to develop a memory cell. For example, the memory cell of Citation 1 is made of a chalcogenide material of which the resistance is varied by application of electric pulses, thus forming a variable resistance type non-volatile memory (TF-RRAM).

In Citation 1, the method of applying a write voltage between the data line and the bit line for writing a data on a target memory cell in the memory cell array is selected between ½ bias mode and ⅓ bias mode. FIGS. 12 and 13 schematically illustrate actions of the ½ bias mode and the ⅓ bias mode respectively for applying a voltage between the data line and the bit line in the memory cell array of a five-row and five-column matrix.

Referring to FIG. 12, the ½ bias mode permits the selected data line and the selected bit line to be applied with a row selecting potential (e.g., Vw) and a column selecting potential (e.g., 0 V) respectively for applying a bias voltage or write voltage Vw (=Vw−0V) to a variable resistor element of the target memory cell (denoted by the circle). Simultaneously, for inhibiting the unselected memory cells, which are not to be written, from being applied with the write voltage Vw (=Vw−0V), their unselected data lines and bit lines not connected with the target memory cell are applied with an intermediate voltage Vw/2 which is equal to a half the write voltage Vw on the basis of the selected bit line. More particularly, particular ones of the unselected memory cells which are connected with the selected data line and the selected bit line but not to be written are positively applied with the intermediate voltage which is too low to execute the writing action. As the ½ bias mode permits the intermediate voltage (equal to a half the write voltage Vw) to be applied to particular ones (denoted by the symbols ◇) of the unselected memory cells which are connected with the selected data line and also particular ones (denoted by the symbols ◇) of the unselected memory cells which are connected with the selected bit line, it will undesirably generate bias currents which thus increases the flows of current along both the selected data line and the selected bit line. FIG. 14 is an equivalent circuitry diagram schematically showing an action of the ½ bias mode where the write current runs through the target memory cell while undesired bias currents run through the unselected memory cells in a memory cell array of m rows by n columns (m and n being any natural numbers).

Referring to FIG. 13, the ⅓ bias mode permits the selected data line and the selected bit line to be supplied with a row selecting potential (e.g., Vw) and a column selecting potential (e.g., 0 V) respectively for applying a bias voltage or write voltage Vw (=Vw−0V) to a variable resistor element of the target memory cell (denoted by the circle). Simultaneously, for inhibiting the unselected memory cells, which are not to be written, from being applied with the write voltage Vw (=Vw−0V), their unselected data lines not connected with the target memory cell are supplied with a voltage Vw/3 which is equal to one third the write voltage Vw on the basis of the selected bit line and their unselected bit lines not connected with the target memory cell are supplied with another voltage 2Vw/3 which is equal to two third the write voltage Vw. More particularly, all the unselected memory cells which are not to be written are positively applied with a bias voltage (|Vw/3|) which is too low to execute the writing action to avoid its reception of the write voltage Vw. As the ⅓ bias mode permits the low bias voltage (equal to one third the write voltage Vw) to be applied to the unselected memory cells (denoted by the symbols ◇) which are connected with the selected data line and the selected bit line and the other unselected memory cells connected with either the unselected data line or the unselected bit line, it will undesirably generate bias currents in the unselected memory cells, thus increasing the flows of current throughout the memory cell array. Meanwhile, the ⅓ bias mode is lower in the bias voltage applied to each of the unselected memory cells than the ½ bias mode. Since the number of the unselected memory cells which is applied with the bias voltage is greater in the ⅓ bias mode, the flows of current throughout the memory cell array will thus be increased proportionally. However, the bias voltage applied to the unselected memory cells connected with the selected data line and the selected bit line is lower than that of the ½ bias mode, the current running in the selected data line or the selected bit line will remain smaller than that of the ½ bias mode. FIG. 15 is an equivalent circuitry diagram schematically showing an action of the ⅓ bias mode where the write current runs through the selected memory cell while undesired bias currents run through the unselected memory cells in a memory cell array of m rows by n columns (m and n being any natural numbers).

FIG. 16 is a circuitry diagram showing an arrangement of data line selecting transistors TD0 to TD4 and bit line selecting transistors TB0 to TB4 connected with the data lines and the bit lines for applying the row selecting potential (Vw), the column selecting potential (e.g., 0 V), and the intermediate voltage (Vw/2) for inhibiting the writing action to each data line and bit line in the memory cell array supplied with voltages at the ½ bias mode shown in FIG. 12. The number of the data lines and the number of the bit lines may arbitrarily be determined. For example, the memory cell array includes a matrix of m rows by n columns (m and n being any natural numbers). The memory cell array shown in FIG. 16 has five rows and five columns.

In the writing action, the current Ids running in the selected data line (DL2 in FIG. 16) is a sum of the write current Iw running in the selected memory cell and the bias currents Ibias running in the unselected memory cells connected with the selected data line as denoted in Equation 1. The bias current Ibias is equal to a total of bias components Ibias0 in the unselected memory cells. However, R in Equation 1 represents a level of the resistance at the low resistance state of the unselected memory cell while n being the number of the bit lines. It is thus assumed that one of the bit lines is selected in every memory cell array. When all the unselected memory cells remain at the low resistance state, the current Ids is a maximum.

$$Ids = Iw + Ibias \quad \text{(Equation 1)}$$
$$= Iw + Ibias0 \times (n-1)$$
$$= Iw + Vw/(2 \times R) \times (n-1)$$

Assuming that the number of the bit lines is 16 in every memory cell array, the resistance R at the low resistance state of the unselected memory cells is 25Ω, and the write voltage is 3 V, the current Ids received by the selected data line and expressed in Equation 1 is denoted by $$Ids = Iw + Vw/(2 \times R) \times (n-1) \quad \text{(Equation 2)}$$
$$= Iw + 1.5(V)/25(k\Omega) \times 15$$
$$= Iw + 900(\mu A)$$

Accordingly, the current driving capability Itds required for the data line selecting transistors is higher than or equal to the current Ids as denoted by Inequation 3.

$$Itds > Iw + 900(\mu A) \quad \text{(Inequation 3)}$$

It is also assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA at best. This may hardly permit the current Ids to run through the selected data line. As the result, the conventional ½ bias mode fails to supply the selected data line with a proper level of the current, hence disabling the writing action with desired writing characteristics.

The conventional ⅓ bias mode will also be examined. FIG. 17 is a circuitry diagram showing an arrangement of data line selecting transistors TDS0 to TDS4 and bit line selecting transistors TBS0 to TBS4 connected with the data lines and the bit lines for applying the row selecting potential (Vw), the column selecting potential (e.g., 0 V), and the bias voltage (Vw/3, 2Vw/3) for inhibiting the writing action in the memory cell array at the conventional ⅓ bias mode shown in FIG. 13. The number of the data lines and the number of the bit lines may arbitrarily be determined. For example, the memory cell array includes a matrix of m rows by n columns (m and n being any natural numbers). The memory cell array shown in FIG. 17 has five rows and five columns.

Similarly in the writing action, the current Ids running in the selected data line (DL2 in FIG. 17) is a sum of the write current Iw running in the selected memory cell and the bias currents Ibias running in the unselected memory cells connected with the selected data line as denoted in Equation 4. The bias current Ibias is equal to a total of bias components Ibias0 in the unselected memory cells. However, R in Equation 4 represents a level of the resistance at the low resistance state of the unselected memory cell while n being the number of the bit lines. It is thus assumed that one of the bit lines is selected in every memory cell array. When all the unselected memory cells remain at the low resistance state, the current Ids is a maximum.

$$Ids = Iw + Ibias \quad \text{(Equation 4)}$$
$$= Iw + Ibias0 \times (n-1)$$
$$= Iw + Vw/(3 \times R) \times (n-1)$$

Assuming that the number of the bit lines is 16 in every memory cell array, the resistance R at the low resistance state of the unselected memory cells is 25Ω, and the write voltage Vw is 3 V, the current Ids received by the selected data line and expressed in Equation 4 is denoted by $$Ids = Iw + Vw/(3 \times R) \times (n-1) \quad \text{(Equation 5)}$$
$$= Iw + 1(V)/25(k\Omega) \times 15$$
$$= Iw + 600(\mu A)$$

Accordingly, the current driving capability Itds required for the data line selecting transistors is higher than or equal to the current Ids as denoted by Inequation 6.

$$Itds > Iw + 600(\mu A) \quad \text{(Inequation 6)}$$

It is also assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA at best. This may permit the drive current received by the target memory cell to be 100 μA or smaller with the current Ids running in the selected data line. As the result, the conventional ⅓ bias mode fails to supply the selected data line with a proper level of the current particularly when the transistor width of the data line selecting transistors is limited or the number of the bit lines in the memory cell array is increased, hence disabling the writing action with desired writing characteristics.

The above description is conditioned with the write current supplied from the data line to the target memory cell. The same drawback may however be expected when the write current is supplied from the bit line to the target memory cell or when the current supplying action of the data line is replaced by that of the bit line.

As explained, the writing action of Citation 1 fails to supply the target memory cell with a proper level of the write current when the variable resistor element in the variable resistance nonvolatile memory for varying its resistance with the application of electric pulses is fabricated of PCMO having a perovskite structure or OUM (ovonic memory) made of chalcogenide compound or metal oxide including a transition metal oxide such as $NiO_2$, $TiO_2$, $HfO_2$, or $ZrO_2$.

As for the relationship between the data line and the bit line at a cross point memory, it is a good idea for ensuring the same effect regardless of the write current supplied from either line that the numbers of rows and columns in the memory cell array are set equal to each other. However in the reading action, the read current determined by the resistance of the target memory cell is measured at either the data line or the bit line. This will discriminate the data line selecting transistors and the bit line selecting transistors from each other in the layout arrangement. In other words, either the data line selecting transistors or the bit line selecting transistors will comparatively be limited in the layout arrangement. For guaranteeing the write current to be supplied to the target memory cell, the current driving capability of the selecting transistors may be increased by expanding the layout arrangement. As the result, the memory size or chip area will be increased thus soaring the overall production cost.

SUMMARY OF THE INVENTION

The present invention has been developed in view of the above drawbacks and its object is to provide a semiconductor storage device which has an array of memory cells, each memory cell including a variable resistor element of which the electric resistance is varied to save a data, connected in a cross point arrangement for maintaining the write current to be supplied to a target memory cell at a desired level without enlarging the size of transistors which develop the write current.

For achievement of the above object of the present invention, a semiconductor storage device is provided, as a first feature, comprising a memory cell array in which a plurality of memory cells each of which includes a variable resistor element of which the electric resistance is varied to store data are arranged in a row and column direction, a plurality of data lines are arranged to extend in the row direction, a plurality of bit lines are arranged to extend in the column direction, and the variable resistor elements in the memory cells in the same row are connected at one end to the data line in common while the variable resistor elements in the memory cells in the same column are connected at the other end to the bit line in common. For conducting a writing action to vary the electric resistance of the variable resistor element in the memory cell to be written by supplying a selected data line of the data lines connected to the memory cell to be written and unselected data lines of the data lines other than the selected data line with a row selecting potential and a row unselecting potential respectively through a data line selecting transistor provided for each of the data lines and supplying a selected bit line of the bit lines connected to the memory cell to be written and unselected bit lines of the bit lines other than the selected bit line with a column selecting potential and a column unselecting potential respectively through a bit line selecting transistor provided for each of the bit lines, the data lines and the bit lines are separately driven so that a write voltage determined by the absolute value of a difference between the row selecting potential and the column selecting potential is higher than a level required for conducting the writing action while a first bias voltage determined by the absolute value of a difference between the row selecting potential and the column unselecting potential, a second bias voltage determined by the absolute value of a difference between the row unselecting potential and the column selecting potential, and a third bias voltage determined by the absolute value of a difference between the row unselecting potential and the column unselecting potential are lower than a level required for conducting the writing action, and the second bias voltage is set lower than the first bias voltage when the data line selecting transistors are higher in the current driving capability than the bit line selecting transistors, and the first bias voltage is set lower than the second bias voltage when the data line selecting transistors are lower in the current driving capability than the bit line selecting transistors.

The write action of the first feature is based on the resistance state of the variable resistor element in the memory cell to be written being varied by the application of electric pulses. For example, the resistance state is shifted from a low state to a high state or vice versa. Accordingly, while the writing action is to shift the variable resistor element from one of the low resistance state and the high resistance state to the other, the resetting action may involve shifting back from the other state to the original state. This allows the resetting action to be treated as a modification of the writing action. The resistance is not limited to the two, high and low, resistance states but may be shifted between three or more different states for conducting the writing action.

In the semiconductor storage device of the first feature, the bias voltage applied to the unselected memory cells connected with the selected data line or the selected bit line which has been selected by the action of either the data line selecting transistors or the bit line selecting transistors whichever are lower in the current driving capability is set with a lower level, hence minimizing the bias components in the current driven by the selecting transistors which are lower in the current driving capability. As the result, the supply of the write current to the selected memory cell can be improved without enlarging the size of the selecting transistors which are smaller in the current driving capability.

The semiconductor storage device of the first feature may be modified as a second feature in which the data lines and the bit lines are separately driven for conducting the writing action so that the first bias voltage is equal to a half of the write voltage when the data line selecting transistors are higher in the current driving capability than the bit line selecting transistors, or the second bias voltage is equal to a half of the write voltage when the data line selecting transistors are lower in the current driving capability than the bit line selecting transistors.

According to the semiconductor storage device of the second feature, a shortage in the supply of the write current to the selected memory cell which is a disadvantage of the conventional ½ bias mode can successfully be compensated by properly modifying either the row unselecting potential received by the unselected data lines or the column unselecting potential received by the unselected bit lines.

The semiconductor storage device of the first feature may further be modified as a third feature in which the data lines and the bit lines are separately driven for conducting the writing action so that the first bias voltage is equal to a third of the write voltage when the data line selecting transistors are higher in the current driving capability than the bit line selecting transistors, or the second bias voltage is equal to a third of the write voltage when the data line selecting transistors are lower in the current driving capability than the bit line selecting transistors.

According to the semiconductor storage device of the third feature, a shortage in the supply of the write current to the selected memory cell which is a disadvantage of the conventional ⅓ bias mode can successfully be compensated by properly modifying either the row unselecting potential received by the unselected data lines or the column unselecting potential received by the unselected bit lines.

The semiconductor storage device of any of the foregoing features may be modified as a fourth feature in which the data lines and the bit lines are separately driven for conducting the writing action so that the second bias voltage is equal to 0 V when the data line selecting transistors are higher in the current driving capability than the bit line selecting transistors, or the first bias voltage is equal to 0 V when the data line selecting transistors are lower in the current driving capability than the bit line selecting transistors.

According to the semiconductor storage device of the fourth feature, the bias voltage applied to the unselected memory cells connected with either the selected data line or the selected bit line which have been selected by the data line selecting transistor or the bit line selecting transistor respectively whichever is lower in the current driving capability is set to 0 V, hence minimizing at optimum the bias components in the current driven by the selecting transistor which is lower in the current driving capability. As the result, the write current to the selected memory cell can be supplied without enlarging the size of the selecting transistors which are smaller in the current driving capability. In brief, the advantage of the semiconductor storage device of the first feature can be significantly enhanced.

The semiconductor storage device of the first feature may further be modified as a fifth feature in which the data lines and the bit lines are separately driven for conducting the writing action so that both the first bias voltage and the second bias voltage are lower than the third bias voltage.

According to the semiconductor storage device of the fifth feature, a shortage in the supply of the write current to the target memory cell which is a disadvantage of the conventional ⅓ bias mode can successfully be compensated by properly modifying either or both of the row unselecting potential received by the unselected data lines and the column unselecting potential received by the unselected bit lines. Particularly when both the row unselecting potential and the column unselecting potential are controllably modified, the bias components in the current driven by the selecting transistors which are higher in the current driving capability can successfully be attenuated thus decreasing the size of the data line selecting transistors and the bit line selecting transistors and thus contributing to the reduction of the overall chip area.

The semiconductor storage device of the first feature may further be modified as a sixth feature in which the data lines and the bit lines are separately driven for conducting the writing action so that the third bias voltage is equal to 0 V.

According to the semiconductor storage device of the sixth feature, similar to the action of the conventional ½ bias mode, the bias voltage is not applied to a number of the unselected memory cells connected with the unselected data lines and the unselected bit lines, and the bias current does not flow into the unselected memory cells. Therefore, while the power consumption at the writing action of the memory cell array is significantly declined, a shortage in the supply of the write current to the selected memory cell which is a disadvantage of the conventional ½ bias mode can successfully be compensated by properly modifying both of the row unselecting potential received by the unselected data lines and the column unselecting potential received by the unselected bit lines at the same time.

The semiconductor storage device of any of the foregoing features may be modified as a seventh feature in which at least a part of a group of transistors including either the data line selecting transistors or the bit line selecting transistors, whichever are higher in the current driving capability, is allocated beneath the memory cell arrays in the memory cell array area.

According to the semiconductor storage device of the seventh feature, since a group of transistors including either the data line selecting transistors or the bit line selecting transistors whichever are higher in the current driving capability or greater in the transistor size is positively placed beneath the memory cell arrays in the memory cell array area, the installation area of the data line selecting transistors and the bit line selecting transistors placed at the outside of the memory cell array area can be minimized thus contributing to the reduction of the overall chip size. It is noted for the present invention that the location beneath the memory cell arrays is determined with reference to the known manufacturing process sequence of semiconductor storage devices. For example, when the memory cell arrays are formed on the predetermined substrate, the side of the substrate is the location beneath the memory arrays.

The semiconductor storage device of any of the foregoing features may further be modified as an eighth feature in which a plurality of the memory cell arrays are arranged at least in the row direction and a plurality of main data lines extend in the row direction corresponding to each of the data lines in the memory cell arrays arranged in the row direction for supplying predetermined row potentials, and each of the main data lines is connected through each of the data line selecting transistors to the corresponding data line in the memory cell arrays.

According to the semiconductor storage device of the eighth feature, the number of the memory cells in each row can be increased without increasing the total number of the memory cells connected to the data lines, hence minimizing the current to be driven by the data line selecting transistors and increasing the overall storage size of the semiconductor storage device. In other words, while the storage size is increased, the write current to the selected memory cell can be supplied without enlarging the overall dimensions of the data line selecting transistors to increase the current driving capability of the same.

Similarly, the semiconductor storage device of any of the foregoing features may further be modified as a ninth feature in which a plurality of the memory cell arrays are arranged at least in the column direction and a plurality of main bit lines extend in the column direction corresponding to each of the bit lines in the memory cell arrays arranged in the column direction for supplying predetermined row potentials, and each of the main bit lines is connected through each of the bit line selecting transistors to the corresponding bit line in the memory cell arrays.

According to the semiconductor storage device of the ninth feature, the number of the memory cells in each column can be increased without increasing the total number of the memory cells connected to the bit lines, hence minimizing the current to be driven by the bit line selecting transistors and increasing the overall storage size of the semiconductor storage device. In other words, while the storage size is increased, the write current to the selected memory cell can be supplied without enlarging the overall dimensions of the bit line selecting transistors to increase the current driving capability of the same.

DETAILED DESCRIPTION OF THE INVENTION

Some embodiments of a semiconductor storage device (referred to as an inventive device hereinafter) according to the present invention will be described referring to the relevant drawings.

First Embodiment

Figure 1:
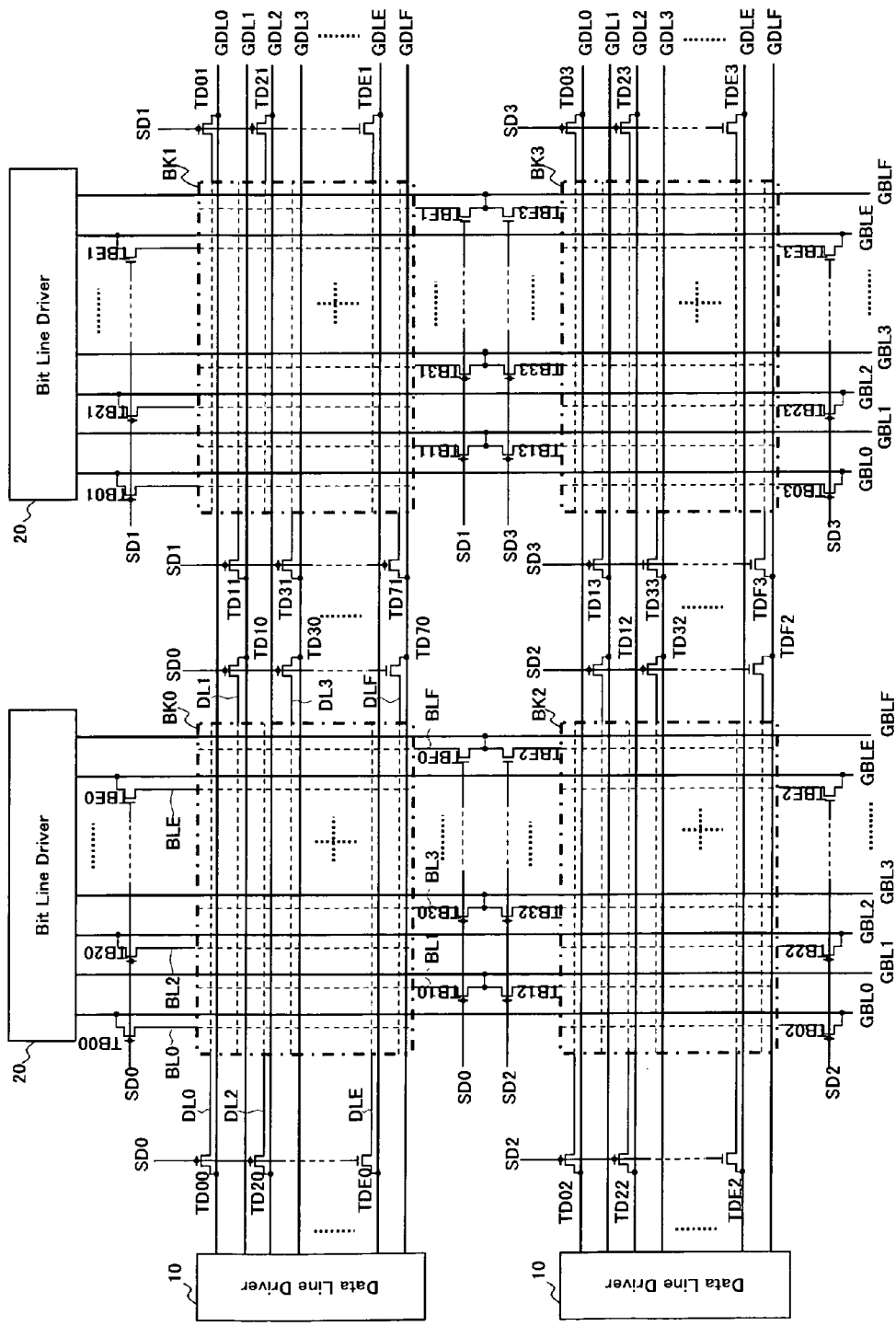
FIG. 1 is a circuitry block diagram schematically showing a block arrangement of the memory cell arrays in a semiconductor storage device according to the present invention.
Figure 2:
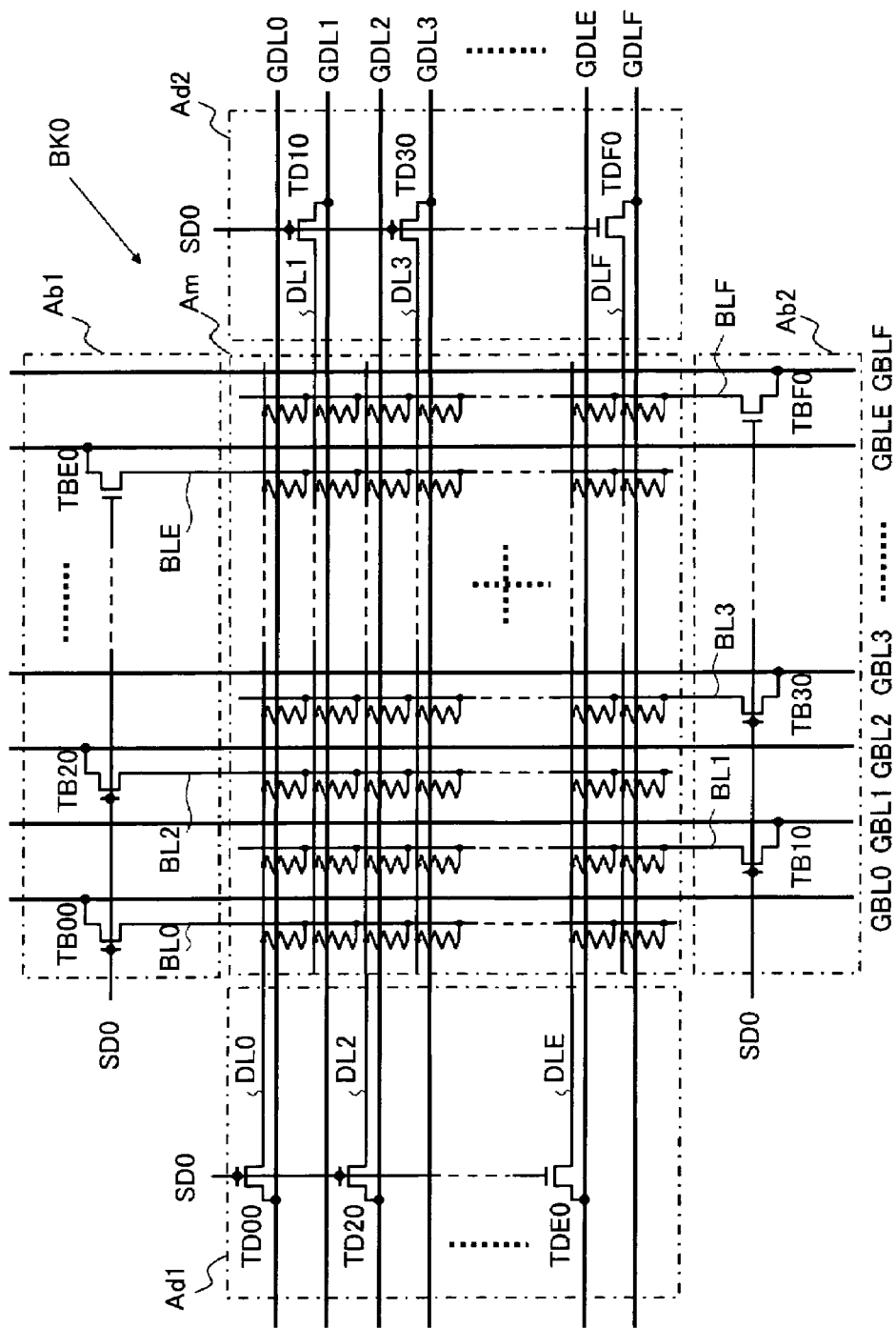
FIG. 2 is a circuitry block diagram concretely showing an array of the memory cells in the semiconductor storage device shown in FIG. 1 according to the present invention.

FIG. 1 is a block diagram of an array of memory cells of the inventive device in the form of a cross point memory of a multi-bank type. As shown in FIG. 2, each of banks BKk (k ranging from 0 to 3) comprises a memory cell array of the cross point type where the memory cells, each including a variable resistor element of which the electrical resistance is varied to save a data, are arranged in a matrix of rows by columns with a number of data lines DLi extending along the rows and a number of bit lines BLj extending along the columns. A group of the memory cells along each row are connected at one end of their variable resistor elements to a common data line while another group of the memory cells along each column are connected at the other end of their variable resistor elements to a common bit line. The data lines DLi and the bit lines BLj of each bank BKk shown in FIG. 1 are briefly denoted by the broken lines while the memory cells are not illustrated for simplicity. The banks, each comprising a memory cell array of the cross point type, are also arranged in a matrix of rows by columns, thus forming a multi-bank memory cell array. The banks BKk shown in FIG. 1 are arranged in, but not limited to, a matrix of two rows by two columns for ease of the description. FIG. 2 illustrates the memory cell array of each bank shown in FIG. 1. For simplicity, the bank BKk comprises a 16-rows by 16-columns array of the memory cells with 16 of the data lines DLi and 16 of the bit lines BLj. The letter "i" in the data line DLi represents the number of each data line while the letter "j" in the bit line BLj represents the number of each bit line. Both the numbers range from 0 to 15 in this embodiment. As shown in FIGS. 1 and 2, the numbers "i" and "j" are expressed in the hexadecimal notation.

In the multi-bank type of this embodiment, the number of main data lines GDLi connected between the banks along the rows is equal to the number of the data lines DLi in each bank (which is sixteen). As shown in FIG. 1, the number of the main data lines GDLi is 16. Similarly, the number of main bit lines GBLj connected between the banks along the columns is equal to the number of the bit lines BLj in each bank (which is sixteen). As shown in FIG. 1, the number of the main bit lines GBLj is 16. The letter "i" in the main data line GDLi represents the number of each main data line as is equivalent to the number "i" of the data line DLi. The letter "j" in the main bit line GBLj represents the number of each main bit line as is equivalent to the number "j" of the bit line BLj.

Also, the main data lines GDLi of each bank BKk (k=0-3) shown in FIG. 1 are connected with their respective data lines DLi by data line selecting transistors TDik respectively which act as bank selecting transistors along the rows. The main bit lines GBLj of each bank BKk are connected with their respective bit lines BLj by bit line selecting transistors TBjk respectively which act as bank selecting transistors along the columns. More particularly, referring to the bank BK0, the main data line GDLi (i=0–15) is connected by the corresponding data line selecting transistor TDi0 (i=0–15) to their respective data line DLi (i=0–15) while the main bit line GBLj (j=0–15) is connected by the corresponding bit line selecting transistor TBj0 (j=0–15) to their respective bit line BLj (j=0–15). The other banks BK1 to BK3 are identical in the arrangement.

In addition, the main data lines GDLi are connected with a data line driver 10 for feeding a predetermined data line potential (row selecting potential and row unselecting potential) to drive separately. The main bit lines GBLj are connected with a bit line driver 20 for feeding a predetermined bit line potential (column selecting potential and column unselecting potential) to drive separately.

The data line selecting transistor TDik has two functions for selecting the bank BKk and connecting the main data line GDLi to the corresponding data line DLi in the selected bank BKk. Similarly, the bit line selecting transistor TBik has two functions for selecting the bank BKk and connecting the main bit line GBLj to the corresponding bit line BLj in the selected bank BKk. The data line selecting transistors TDik (i=0-15) and the bit line selecting transistors TBjk (j=0-15) are connected at each gate to a bank selecting line SDk. Since each bank BKk is accompanied with the bank selecting line SDk, it can selectively be controlled.

In this embodiment, the data line selecting transistors TDik are separated along the rows into two groups, an even number group (i=0, 2, 4, . . . 14) corresponding to the data lines DLi at the even numbers and an odd number group (i=1, 3, 5, . . . 15) corresponding to the data lines DLi at the odd numbers. Also, the bit line selecting transistors TBjk are separated along the columns into two groups, an even number group (j=0, 2, 4, . . . 14) corresponding to the bit lines BLj at the even numbers and an odd number group (j=1, 3, 5, . . . 15) corresponding to the bit lines BLj at the odd numbers. The data line selecting transistors TDik and the bit line selecting transistors TBjk shown in FIGS. 1 and 2 are arranged in an equivalent circuit for illustrating the relationship of electrical connections but not simulating the actual circuitry layout.

The action of bias mode will now be described for supplying the data lines DLi and the bit lines BLj with corresponding row potential and column potential to execute the writing action at each bank (for example, the bank BK0). It is assumed that the bias mode of this embodiment allows the data line selecting transistors TDik to be lower in the current drive capability than the bit line selecting transistors TBjk when the writing action executed for one of the memory cells in the memory cell array of 16 rows by 16 columns. The writing action involves changing the resistance of the variable resistor element in the memory cell into which a data is written through applying electric pulses. More particularly, the writing action may be a shift from a lower level to a higher level of the resistance.

Figure 3:
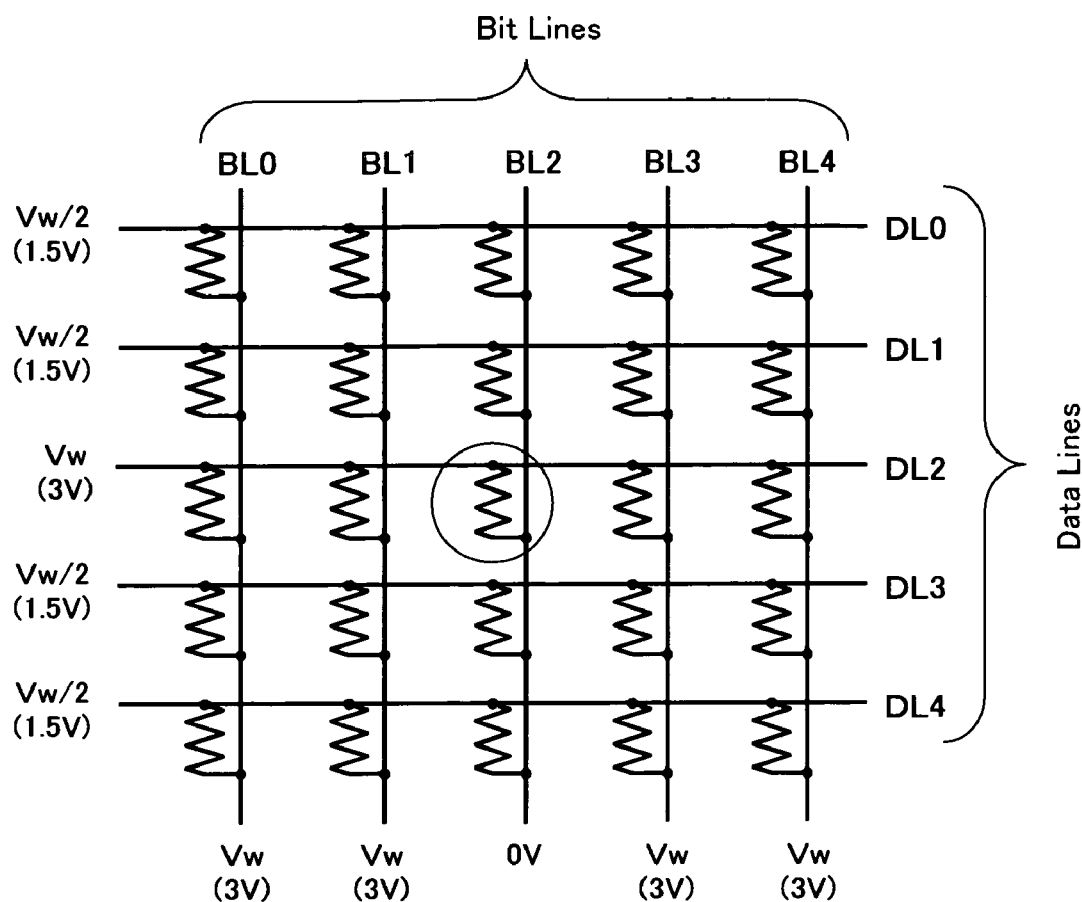
FIG. 3 is a schematic circuitry diagram of the memory cell array showing a writing action at the bias mode in the semiconductor storage device as a first embodiment of the present invention.
Figure 4:
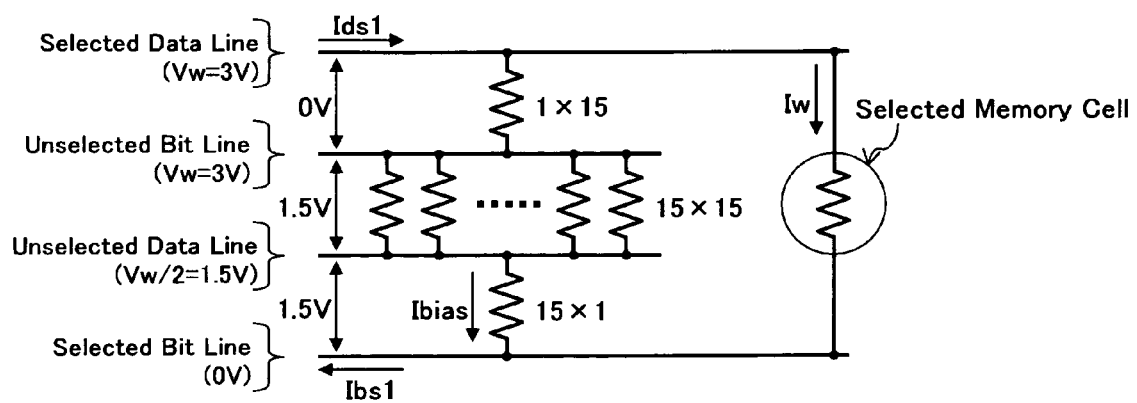
FIG. 4 is an equivalent circuitry diagram of the memory cell array which is applied with a voltage for conducting the writing action at the bias mode in the semiconductor storage device of the first embodiment of the present invention.

Referring to FIGS. 3 and 4, the writing action at the bias mode in the first embodiment will be described. FIG. 3 illustrates specifically a region (five rows by five columns) of the 16×16 matrix of the memory cell array where the memory cell denoted by the circle is a target cell to be written while the other memory cells remain intact. The data line DL2 and the bit line BL2 connected with the target memory cell are a selected data line and a selected bit line respectively. The other data lines DLi (i≠2) and the other bit lines BLj (j≠2) are unselected data lines and unselected bit lines. According to this embodiment, the write current is supplied from the selected data line DL2 to the target memory cell.

As shown in FIG. 3, the selected data line DL2 and the selected bit line BL2 are supplied with a row selecting potential Vw (for example, Vw=3V) and a column selecting potential (for example, 0 V) respectively thus to supply the target memory cell with the write voltage Vw (=Vw−0V=3V). Simultaneously, the unselected data lines DLi (i≠2) are supplied with a row unselecting potential Vw/2 (for example, 1.5 V) while the unselected bit lines BLj (j≠2) are supplied with a column unselecting potential Vw (for example, Vw=3V). FIG. 4 is an equivalent circuitry diagram showing separately the write current running across the target memory cell and the undesired bias currents running across the unselected memory cells in the memory cell array supplied with a voltage at the bias mode shown in FIG. 3.

In the writing action of this embodiment, when the row selecting potential Vw and the column unselecting potential Vw to be applied to the unselected memory cells connected with the selected data line DL 2 are equal to each other, the first bias voltage which is determined by the absolute value of a difference between the row selecting potential Vw and the column unselecting potential Vw remains at 0 V thus permitting the unselected memory cells to be applied with no voltage. More specifically, as expressed in Equation 7, the current Ids1 received from the selected data line DL2 is equal to the write current Iw running across the target memory cell.

$$Ids1 = Iw \quad \text{(Equation 7)}$$

On the other hand, the second bias voltage which is determined by the absolute value of a difference between the column selecting potential (0 V) and the row unselecting potential (Vw/2=1.5V) applied to the unselected memory cells connected with the selected bit line BL2 is at an intermediate level (Vw/2=1.5V) which is too low to execute the writing action or the resetting action, thus permitting the unselected memory cells to stay out of the writing action or the resetting action which will be explained later in more detail. Meanwhile, the current Ibs1 received by the selected bit line BL2 is a sum of the write current Iw running in the target memory cell and a bias current Ibias running in the unselected memory cells which have been applied with the intermediate voltage (Vw/2=1.5V). The bias current Ibias is equal to a total of bias components Ibias0 in the unselected memory cells. However, R in Equation 8 represents a level of the resistance at the low resistance state of the unselected memory cell. When all the unselected memory cells remain at the low resistance state, the current Ibs1 is a maximum.

$$\begin{aligned} Ibs1 &= Iw + Ibias \quad \text{(Equation 8)} \\ &= Iw + Ibias0 \times 15 \\ &= Iw + Vw/(2 \times R) \times 15 \end{aligned}$$

It is assumed in this embodiment that the data line selecting transistors TDik are lower in the current driving capability than the bit line selecting transistors TBjk. While the data line selecting transistors TDik having a lower level of the current driving capability are simply supplied with the write current for the target memory cell, the bias mode will be favorable for such a particular situation.

The bias mode of this embodiment is different from the conventional ½ bias mode. In particular, the unselected memory cells connected with the unselected data lines DLi (i≠2) and the unselected bit lines BLj (j≠2) are applied with a third bias voltage Vw/2 which is determined by the absolute value of a difference between the row unselecting potential Vw/2 and the column unselecting potential Vw and not equal to 0 V, but equal to an intermediate level (Vw/2=1.5V) which is too low to execute the writing action or the resetting action. This allows the unselected memory cells to stay free from the writing action or the resetting action while being supplied with the bias currents.

The current driving capability Itds needed for the data line selecting transistors TDik, which are lower in the current driving capability, at the bias mode of this embodiment will further be described in comparison with the conventional ½ bias mode, assuming that the resistance R at the low resistance state of the unselected memory cells is 25Ω and the write voltage Vw is 3 V in the memory cell array of 16 rows by 16 columns.

Figure 16:
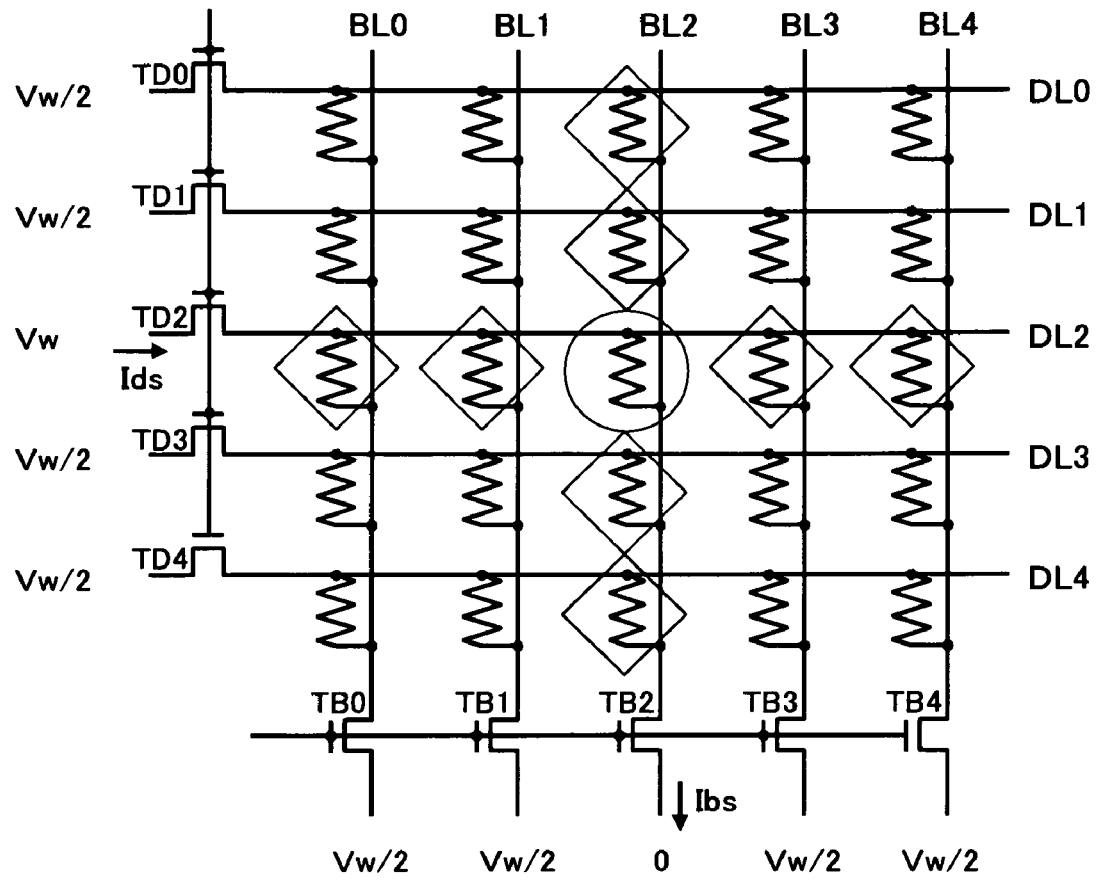
FIG. 16 is a schematic circuitry diagram of the memory cell array showing another writing action at the conventional ½ bias mode.

The current Ids received by the selected data line (DL2 shown in FIG. 16) at the conventional ½ bias mode is a sum of the write current Iw running in the target memory cell and the bias current Ibias running in the unselected memory cells connected with the selected data line as denoted in Equation 1 and Equation 2. The current driving capability Itds is hence required to produce the current Ids or greater as apparent from Inequation 3. The bias mode of this embodiment allows the current Ids1 received by the selected data line (DL2 shown in FIG. 3) to include simply the write current Iw supplied to the target memory cell as apparent from Equation 7. Accordingly, the current driving capability Itds is low enough to ensure the write current Iw at least.

It is now assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA. While the conventional ½ bias mode fails to supply the selected data line with a proper level of the current, the bias mode of this embodiment allows the selected data line to be supplied favorably with the write current Iw.

Then, the current driving capability Itbs needed for the bit line selecting transistors TBjk, which is higher in the current driving capability, will be examined assuming that the resistance R at the low resistance state of the unselected memory cells is 25Ω and the write voltage Vw is 3 V in the memory cell array of 16 rows by 16 columns.

Figure 5:
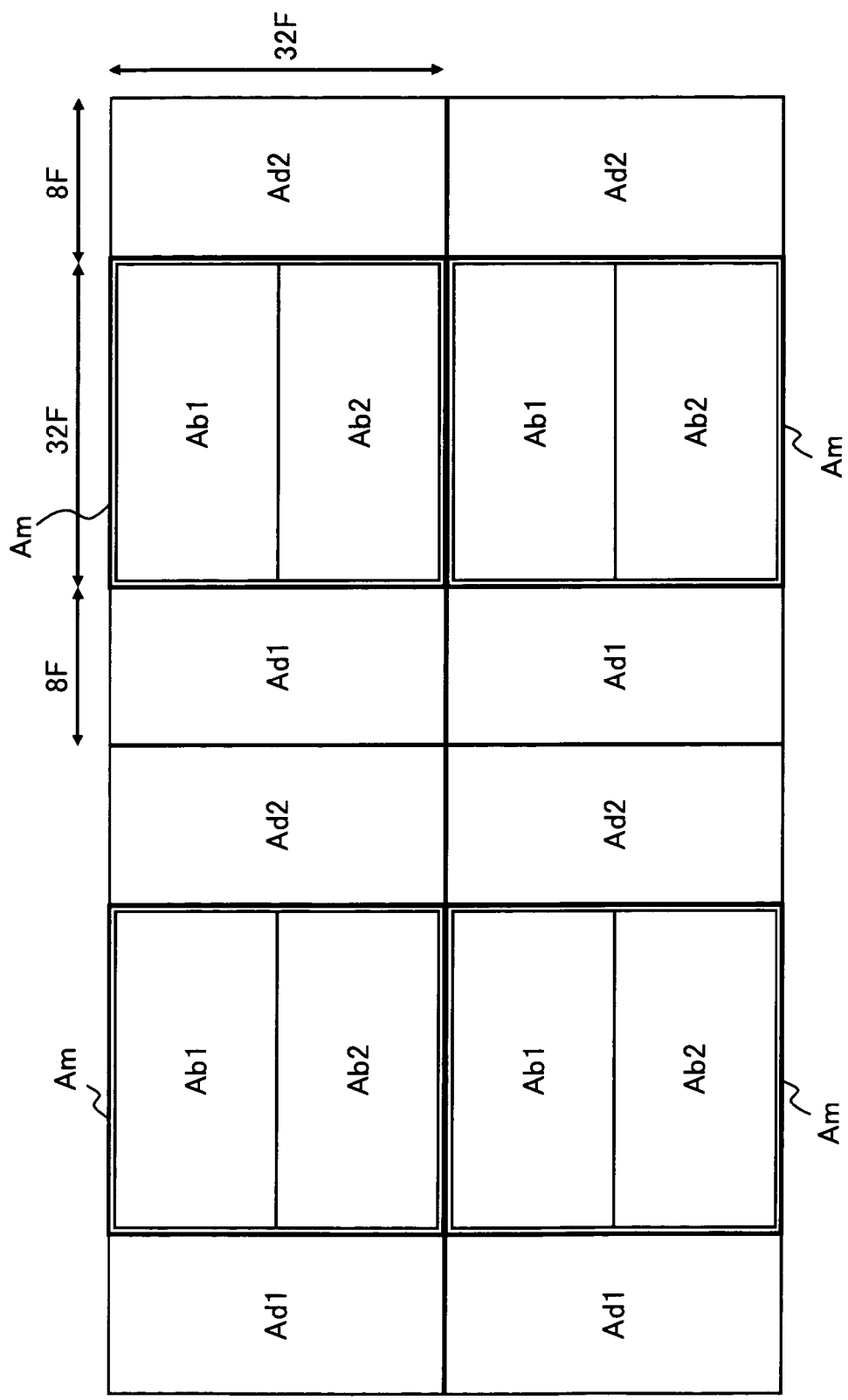
FIG. 5 is a circuitry diagram of the memory cell array showing an example of the layout arrangement of the memory cells, the data line selecting transistors, and the bit line selecting transistors in the semiconductor storage device of the first embodiment of the present invention.

The layout relationship between the data line selecting transistors TDik which are lower in the current driving capability and the bit line selecting transistors TBjk which is higher in the current driving capability will be explained referring to FIG. 5. As the area of each memory cell in the memory cell array of 16 rows by 16 columns is determined by the distance pitch between the data line DLi and the bit line BLj, the size of the memory cell array is expressed by 32F by 32F where F is a minimum unit in the manufacturing process. Since each memory cell in the memory cell array of the cross point type does not include any other element than the variable resistor element and its metallic electrodes which requires the active area of semiconductors such as selected transistors, relevant transistors in the peripheral circuit can be disposed in the memory cell array area Am as placed over or beneath the memory cells. When the bit line selecting transistors TBjk which are higher in the current driving capability are located beneath the memory cells in the memory cell array area Am, as shown in FIG. 5, the installation areas Ab1 and Ab2 of the bit line selecting transistors TBjk can be minimized thus contributing to the reduction of the overall chip size. In this case, the transistor width of the bit line selecting transistors TBjk can be as generous as 16F which is equal to a half the side, 32F, of the memory cell array. In case of 0.13 μm process, the transistor width of the bit line selecting transistors TBjk is 2.08 μm and the current driving capability Itbs will be as high as 1400 μA. As shown in FIG. 5, the data line selecting transistors in this embodiment are separated into two groups connected with the even number data lines and the odd number data lines respectively and favorably allocated to two corresponding areas Ad1 and Ad2 outside the memory cell array area Am.

Assuming that the resistance R at the low resistance state of the unselected memory cells is 25Ω and the write voltage is 3 V, the current Ibs1 received by the selected bit line and expressed in Equation 8 is denoted by:

$$Ibs1 = Iw + Vw/(2 \times R) \times 15 \qquad \text{(Equation 9)}$$
$$= Iw + 3(V)/50(k\Omega) \times 15$$
$$= Iw + 900(\mu A)$$

Accordingly, the current driving capability Itbs required for the bit line selecting transistors TBjk is higher than or equal to the current Ibs1 as denoted by Inequation 10, whereby the write current Iw can be provided at a maximum of 500 μA. The bias mode in this embodiment permits the current driving capability Itbs required for the bit line selecting transistors TBjk to be high enough to draw the write current Iw from the target memory cell.

$$Itbs > Iw + 900(\mu A) \qquad \text{(Inequation 10)}$$

The resetting action of the bias mode will be described for supplying the data line DLi and bit line BLj in each bank (for example, the bank BK0) of the inventive device with a row potential and a column potential respectively. It is also assumed that the data line selecting transistors TDik are lower in the current driving capability than the bit line selecting transistors TBjk and one of the memory cells in an array of 16 rows by 16 columns is to be reset. The resetting action involves changing the resistance state of the variable resistor element in the target memory cell as conducting a reverse of the writing action through applying electrical pulses. For example, the resetting action may be a shift from the high resistance state to the low resistance state. In brief, the resetting action is a modification of the writing action for shifting the resistance state of the variable resistor element to another state.

Figure 6:
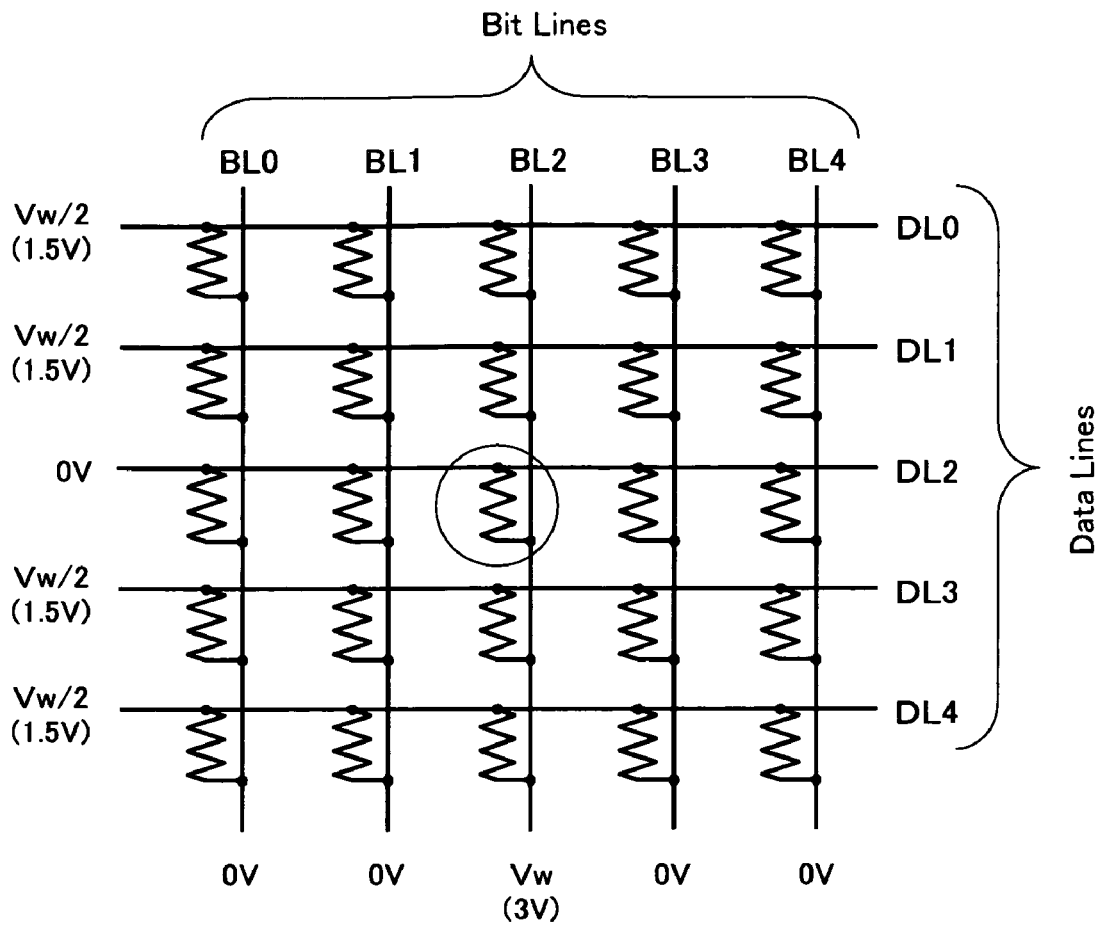
FIG. 6 is a schematic circuitry diagram of the memory cell array showing a resetting action at the bias mode in the semiconductor storage device of the first embodiment of the present invention.
Figure 7:
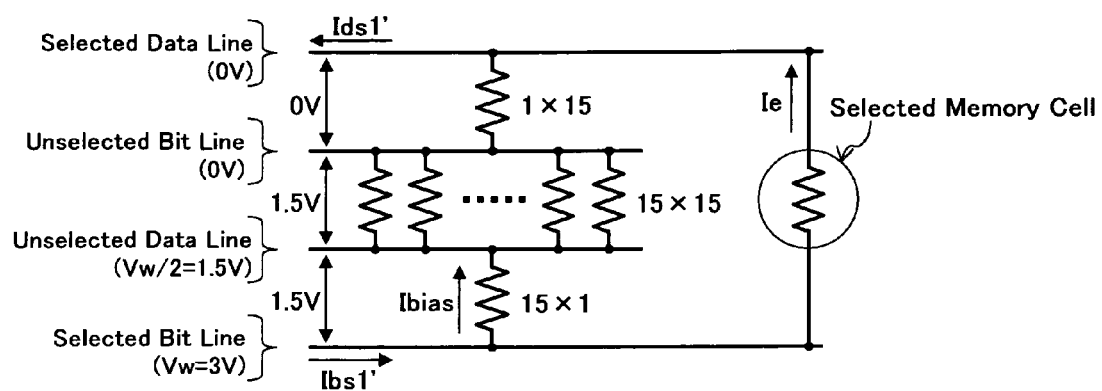
FIG. 7 is an equivalent circuitry diagram of the memory cell array which is applied with a voltage for conducting the resetting action at the bias mode in the semiconductor storage device of the first embodiment of the present invention.

Referring to FIGS. 6 and 7, the resetting action at the bias mode in the first embodiment will be described. FIG. 6 illustrates specifically a region (five rows by five columns) of the 16×16 matrix of the memory cell array where the memory cell denoted by the circle is a target cell to be reset while the other memory cells remain intact. The data line DL2 and the bit line BL2 connected with the target memory cell are a selected data line and a selected bit line respectively. The other data lines DLi (i≠2) and the other bit lines BLj (j≠2) are unselected data lines and unselected bit lines. According to this embodiment, the reset current (a negative current) is supplied from the selected data line DL2 to the target memory cell. The current received by the target memory cell runs from the selected bit line BL2 to the selected data line DL2.

As shown in FIG. 6, the selected data line DL2 and the selected bit line BL2 are supplied with a row selecting potential (for example, 0 V) and a column selecting potential Vw for example, Vw=3V) respectively thus to supply the target memory cell with the reset voltage (0V−Vw=−Vw=−3V) of which the polarity is opposite to that of the write voltage. Simultaneously, the unselected data lines DLi (i≠2) are supplied with a row unselecting potential Vw/2 (for example, 1.5 V) while the unselected bit lines BLj (j≠2) are supplied with a column unselecting potential (for example, 0V). FIG. 7 is an equivalent circuitry diagram showing separately the reset current running across the target memory cell and the undesired bias currents running across the unselected memory cells in the memory cell array supplied with a voltage at the bias mode shown in FIG. 6.

In the resetting action of this embodiment, when the row selecting potential (0 V) and the column unselecting potential (0 V) are equal, the first bias voltage, which is determined by the absolute value of a difference between the row selecting potential Vw and the column unselecting potential Vw, supplied to the unselected memory cells connected with the selected data line DL2 remains at 0 V thus permitting the unselected memory cells to be applied with no voltage. More specifically, as expressed in Equation 11, the positive current Ids1' received by the selected data line DL2 is equal to the absolute Ie of the reset current which runs across the target memory cell.

$$Ids1' = Ie \quad \text{(Equation 11)}$$

On the other hand, the second bias voltage which is determined by the absolute value of a difference between the column selecting potential (Vw=3V) and the row unselecting potential (Vw/2=1.5V) applied to the unselected memory cells connected with the selected bit line BL2 is at an intermediate level (Vw/2=1.5V) which is too low to execute the writing action or the resetting action, thus permitting the unselected memory cells to stay out of the writing action or the resetting action. Meanwhile, as expressed in Equation 12 below, the current Ibs1' received from the selected bit line BL2 is a sum of the absolute Ie of the reset current running in the target memory cell and a bias current Ibias running in the unselected memory cells which have been applied with the intermediate voltage (Vw/2=1.5V). The bias current Ibias is equal to a total of bias components Ibias0 in the unselected memory cells. However, R in Equation 12 represents a level of the resistance at the low resistance state of the unselected memory cell. When all the unselected memory cells remain at the low resistance state, the current Ibs1' is a maximum.

$$\begin{aligned} Ibs1' &= Ie + Ibias \\ &= Ie + Ibias0 \times 15 \\ &= Ie + Vw/(2 \times R) \times 15 \end{aligned} \quad \text{(Equation 12)}$$

It is yet preset in this embodiment that the data line selecting transistors TDik are lower in the current driving capability than the bit line selecting transistors TBjk. While the data line selecting transistors TDik having a lower level of the current driving capability are simply supplied with (or draws) the reset current for the target memory cell, the bias mode will be favorable for such a particular situation.

The bias mode of this embodiment is different from the conventional ½ bias mode. In particular, the unselected memory cells connected with the unselected data lines DLi (i≠2) and the unselected bit lines BLj (j≠2) are applied with a third bias voltage Vw/2 which is determined by the absolute value of a difference between the row unselecting potential Vw/2 and the column unselecting potential Vw and not equal to 0 V but equal to an intermediate level (Vw/2=1.5V) which is too low to execute the writing action or the resetting action. This allows the unselected memory cells to stay free from the writing action or the resetting action while being supplied with the bias currents.

The current driving capability Itds needed for the data line selecting transistors TDik, which are lower in the current driving capability, at the bias mode of this embodiment will further be described in comparison with the conventional ½ bias mode, assuming that the resistance R at the low resistance state of the unselected memory cells is 25Ω and the reset voltage (−Vw) is −3 V in the memory cell array of 16 rows by 16 columns. While the conventional ½ bias mode is identical in the potentials received by the selected data line DL2, the selected bit line BL2, and the unselected data lines DLi (i≠2) to the bias mode at the resetting action in the first embodiment shown in FIG. 6, it is differentiated from this embodiment by the fact that the column unselecting potential supplied to the unselected bit lines BLj (j≠2) is equal to the row unselecting potential Vw/2 (for example, 1.5 V) supplied to the unselected data lines DLi (i≠2).

The positive current Ids' received by the selected data line in the resetting action at the conventional ½ bias mode is a sum of the absolute Ie of the reset current running in the target memory cell and the bias current Ibias running in the unselected memory cells connected with the selected data line as denoted in Equation 13 shown below. The current driving capability Itds is hence required to produce the current Ids' or higher as apparent from Inequation 14. It is noted that R in Equation 13 is a level of the resistance at the low resistance state of the unselected memory cells. The current Ids' is hence a maximum level when all the unselected memory cells are at the low resistance state.

$$\begin{aligned} Ids' &= Ie + Ibias \\ &= Ie + Ibias0 \times 15 \\ &= Ie + Vw/(2 \times R) \times 15 \\ &= Ie + 3(V)/50(k\Omega) \times 15 \\ &= Ie + 900(\mu A) \end{aligned} \quad \text{(Equation 13)}$$

$$Itbs > Ie + 900(\mu A) \quad \text{(Inequation 14)}$$

The bias mode of this embodiment allows the current Ids1' received by the selected data line DL2 to include simply the absolute Ie of the reset current supplied to the target memory cell as apparent from Equation 11. Accordingly, the current driving capability Itds is low enough to ensure the absolute Ie of the reset current at least.

It is now assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA. While the conventional ½ bias mode fails to supply the selected data line with a proper level of the current, the bias mode of this embodiment allows the selected data line to be supplied favorably with the reset current (−Ie).

Then, the current driving capability Itbs needed for the bit line selecting transistors TBjk, which are higher in the current driving capability, will be examined assuming that the resistance R at the low resistance state of the unselected memory cells is 25Ω and the reset voltage (−Vw) is −3 V in the memory cell array of 16 rows by 16 columns. At the time, the current Ibs1' received by the selected bit line denoted by Equation 12 is then expressed by Equation 15.

$$\begin{aligned} Ibs1' &= Ie + Vw/(2 \times R) \times 15 \\ &= Ie + 3(V)/50(k\Omega) \times 15 \\ &= Ie + 900(\mu A) \end{aligned} \quad \text{(Equation 15)}$$

Assuming that the bit line selecting transistors TBjk which are higher in the current driving capability are located beneath the memory cells in the memory cell array area, the transistor width of the bit line selecting transistors TBjk can be as generous as 16F which is equal to a half the side, 32F, of the memory cell array in this embodiment. In case of 0.13 μm process, the transistor width of the bit line selecting transistors TBjk is 2.08 μm and the current driving capability Itbs will be as high as 1400 μA.

Accordingly, the current driving capability Itbs required for the bit line selecting transistors TBjk is greater than or equal to the current Ibs1' as denoted by Inequation 16 shown below, whereby the absolute Ie of the reset current can be provided at a maximum of 500 μA. The bias mode in this embodiment permits the current driving capability Itbs required for the bit line selecting transistors TBjk to be high enough to provide the target memory cell with the absolute Ie of the reset current.

$$Itbs > Ie + 900 (\mu A) \qquad \text{(Inequation 16)}$$

As explained, the writing action and the resetting action are differentiated from each other by the fact that that the row selecting potential and the column selecting potential to be supplied to the selected data line DL2 and the selected bit line BL2 are exchanged with each other. More particularly, while the voltage applied to the target memory cell and the current running across the target memory cell are reversed in the polarity, the potential which is set equal to the column unselecting potential received by the unselected bit lines BLj (j≠2) is switched between the row selecting potential and the column selecting potential. However, since the first bias voltage, which is determined by the absolute value of a difference between the row selecting potential and the column selecting potential, supplied to the unselected memory cells connected with the selected data line DL2 remains at 0 V in either the writing action or the resetting action, both the current driving capability Itds required for the data line selecting transistors TDik and the current driving capability Itbs required for the bit line selecting transistors TBjk will be equal between the two actions.

Second Embodiment

A second embodiment of the present invention will be described. The inventive device of the second embodiment is also a cross point memory of the multi-bank type similar to that of the first embodiment. As the block arrangement is identical to that of the first embodiment shown in FIGS. 1 and 2, its overlapping description will be omitted. The second embodiment is differentiated from the first embodiment by an action of the bias mode for supplying each of the data lines DLi and each of the bit lines BLj in a target bank (for example, the bank BK0) with a row potential and a column potential respectively to conduct the writing action. The bias mode will now be described in more detail. It is assumed in the second embodiment similar to the first embodiment that the data line selecting transistors TDik are lower in the current driving capability than the bit line selecting transistors TBjk and one of the memory cells in a 16×16 array is a target memory cell to be written.

Figure 8:
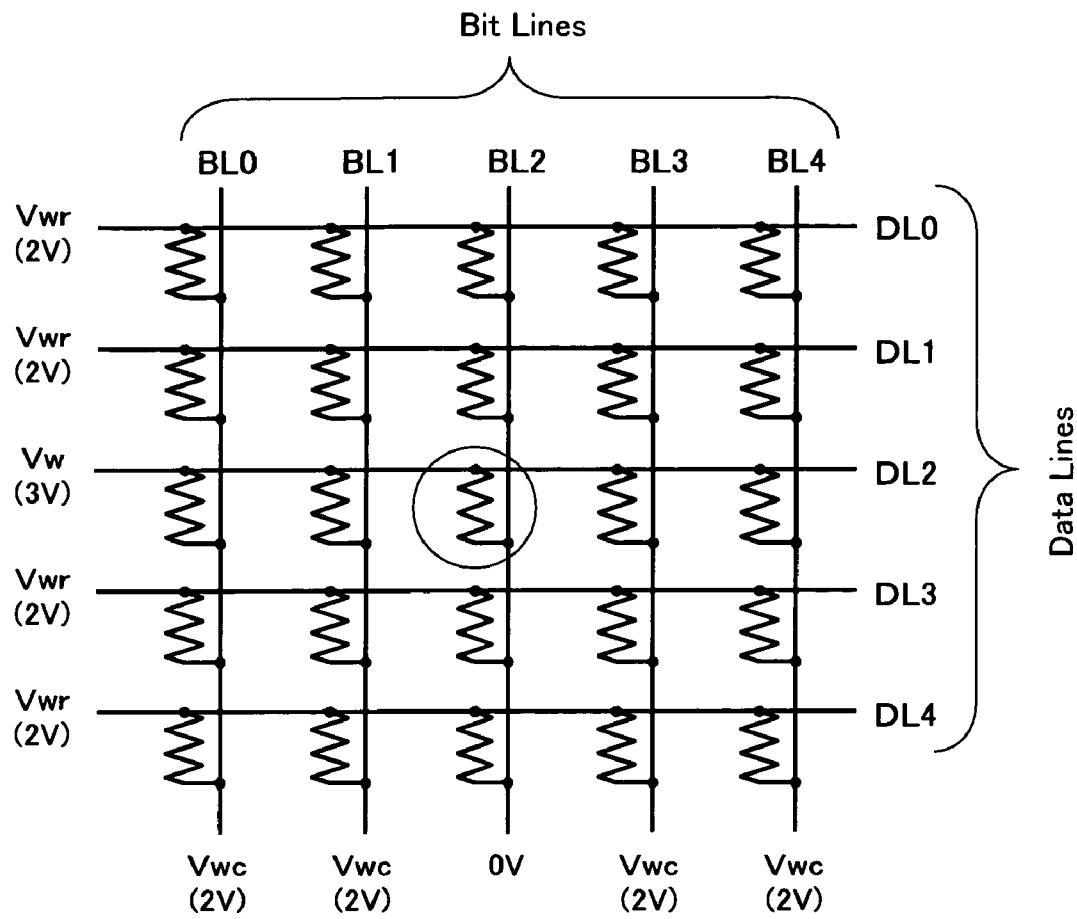
FIG. 8 is a schematic circuitry diagram of the memory cell array showing a writing action at the bias mode in the semiconductor storage device as a second embodiment of the present invention.
Figure 9:
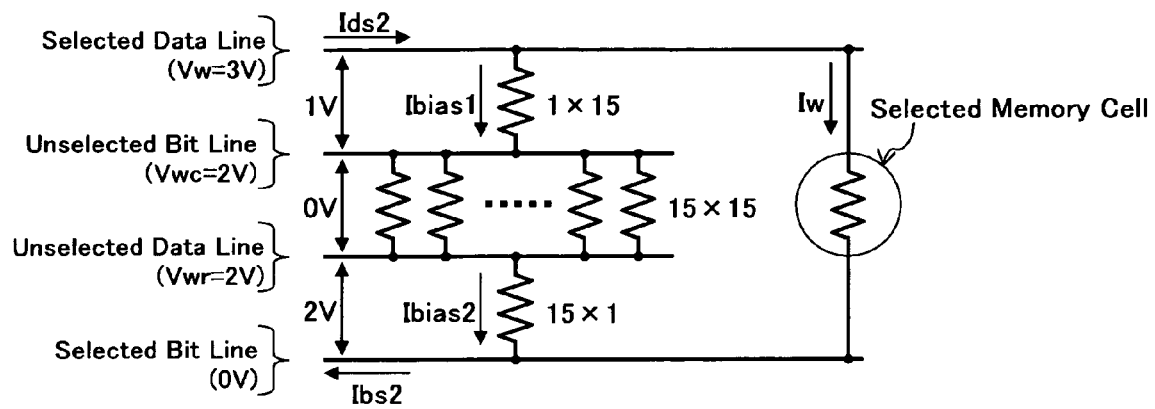
FIG. 9 is an equivalent circuitry diagram of the memory cell array which is applied with a voltage for conducting the writing action at the bias mode in the semiconductor storage device of the second embodiment of the present invention.

Referring to FIGS. 8 and 9, the writing action at the bias mode in the second embodiment will be described. FIG. 8 illustrates specifically a region (five rows by five columns) of the 16×16 matrix of the memory cell array where the memory cell denoted by the circle is a target cell to be written while the other memory cells remain intact. The data line DL2 and the bit line BL2 connected with the target memory cell are a selected data line and a selected bit line respectively. The other data lines DLi (i≠2) and the other bit lines BLj (j≠2) are unselected data lines and unselected bit lines. According to this embodiment, the write current is supplied from the selected data line DL2 to the target memory cell.

As shown in FIG. 8, the selected data line DL2 and the selected bit line BL2 are supplied with a row selecting potential Vw (for example, Vw=3V) and a column selecting potential (for example, 0 V) respectively thus to supply the target memory cell with the write voltage Vw (=Vw−0=3V). Simultaneously, the unselected data lines DLi (i≠2) are supplied with a row unselecting potential Vwr (for example, Vwr=2V) while the unselected bit lines BLj (j≠2) are supplied with a column unselecting potential Vwc (for example, Vwc=Vwr=2V). FIG. 9 is an equivalent circuitry diagram showing separately the write current running across the target memory cell and the undesired bias currents running across the unselected memory cells in the memory cell array supplied with a voltage at the bias mode shown in FIG. 8.

In the writing action of this embodiment which is different from the first embodiment, when the row selecting potential Vw and the column unselecting potential Vw to be applied to the unselected memory cells connected with the selected data line DL 2 are not equal to each other, the first bias voltage (Vw−Vwc=1V) which is determined by the absolute value of a difference between the row selecting potential Vw and the column unselecting potential Vwc becomes lower than the first bias voltage (Vw/2=1.5V) of the conventional ½ bias mode. As the first bias voltage is lower than a level required for the writing action or the resetting action, the unselected memory cells connected with the selected data line DL2 stay free from the writing action and the resetting action. Also, the bias current Ibias1 running in the unselected memory cells connected with the selected data line DL2 becomes smaller than that of the conventional ½ bias mode. Meanwhile, the current Ids2 received from the selected data line DL2 is a sum of the write current Iw running in the target memory cell and a bias current Ibias 1 running in the unselected memory cells as denoted by Equation 17. The bias current Ibias1 is equal to a total of bias components Ibias10 running in the unselected memory cells. However, R in Equation 17 represents a level of the resistance at the low resistance state of the unselected memory cell. When all the unselected memory cells remain at the low resistance state, the current Ids2 is a maximum.

$$\begin{aligned} Ids2 &= Iw + Ibias1 \\ &= Iw + Ibias10 \times 15 \\ &= Iw + (Vw \cdot Vwc)/R \times 15 \end{aligned} \qquad \text{(Equation 17)}$$

On the other hand, the second bias voltage which is determined by the absolute value of a difference between the column selecting potential (0 V) and the row unselecting potential (Vwr=2V) applied to the unselected memory cells connected with the selected bit line BL2 is 2 V which is too low to execute the writing action or the resetting action, thus permitting the unselected memory cells to stay out of the writing action or the resetting action. Similarly, the current Ibs2 received by the selected bit line BL2 is equal to a sum of the write current Iw running in the target memory cell and a bias current Ibias2 running in the unselected memory cells connected with the selected bit line BL2 as denoted by Equation 18. The bias current Ibias2 is equal to a total of bias components Ibias20 running in the unselected memory cells. However, R in Equation 18 represents a level of the resistance at the low resistance state of the unselected memory cell. When all the unselected memory cells remain at the low resistance state, the current Ibs2 is a maximum.

$$\begin{aligned} Ibs2 &= Iw + Ibias2 \\ &= Iw + Ibias20 \times 15 \\ &= Iw + Vwr/R \times 15 \end{aligned} \qquad \text{(Equation 18)}$$

As apparent from the comparison between Equation 17 and Equation 18, the first bias voltage (Vw−Vwc=1V) is lower than the second bias voltage (Vwr=2V). This permits the current Ids2 received from the selected data line DL2 to be smaller than the current Ibs2 received by the selected bit line BL2. Since the data line selecting transistors TDik are set lower in the current driving capability than the bit line selecting transistors TBjk, the bias mode in this embodiment will be favorable for such a particular situation.

As the bias mode of this embodiment is equal to the conventional ½ bias mode, the unselected memory cells connected with the unselected data lines DLi (i≠2) and the unselected bit lines BLj (j≠2) are applied with a third bias voltage (|Vwr−Vwc|) which is determined by the absolute value of a difference between the row unselecting potential Vwr and the column unselecting potential Vwc. Since the third bias voltage is 0 V, the unselected memory cells can stay free from the writing action or the resetting action while being supplied with no bias currents.

The current driving capability Itds needed for the data line selecting transistors TDik, which are lower in the current driving capability, at the bias mode of this embodiment will further be described in comparison with the conventional ½ bias mode, assuming that the resistance R at the low resistance state of the unselected memory cells is 25Ω, the write voltage Vw is 3 V, and each of the row unselecting potential Vwr and the column unselecting potential Vwc is 2 V in the memory cell array of 16 rows by 16 columns.

The current Ids2 received by the selected data line and denoted by Equation 17 is now expressed by Equation 19 below.

$$Ids2 = Iw + (Vw - Vwc)/R \times 15 \quad \text{(Equation 19)}$$
$$= Iw + 1(V)/25(k\Omega) \times 15$$
$$= Iw + 600(\mu A)$$

The current Ids received by the selected data line (DL2 shown in FIG. 16) at the conventional ½ bias mode is a sum of the write current Iw running in the target memory cell and the bias current Ibias running in the unselected memory cells connected with the selected data line. Hence as apparent from Inequation 3, the current driving capability Itds has to be greater than or equal to the current Ids. The bias mode of the second embodiment allows the current Ids received by the selected data line (DL2 shown in FIG. 8) to be equal to a sum of the write current Iw running in the target memory cell and the bias current Ibias1 (600 μA) running in the unselected memory cells connected with the selected data line DL2 as apparent from Equation 19.

As apparent from the comparison between Equation 19 and Equation 2, the first bias voltage (Vw−Vwc=1V) in the second embodiment is lower than the first bias voltage (Vw/2=1.5V) in the conventional ½ bias mode. Accordingly, the current Ids2 received from the selected data line DL2 in the second embodiment is smaller than the current Ids in the conventional ½ bias mode, thus permitting the current driving capability for the data line selecting transistors TDik to be set with a lower level.

It is now assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA. While the conventional ½ bias mode fails to supply the selected data line with a proper level of the current, the bias mode of this embodiment allows the selected data line to be supplied favorably with the write current Iw of not greater than 100 μA.

Then, the current driving capability Itbs needed for the bit line selecting transistors TBjk, which is higher in the current driving capability, will be examined assuming that the resistance R at the low resistance state of the unselected memory cells is 25Ω and the write voltage Vw is 3 V in the memory cell array of 16 rows by 16 columns. The current Ibs2 received by the selected bit line BL2 and denoted by Equation 18 is now expressed by Equation 20 below.

$$Ibs2 = Iw + Vwr/R \times 15 \quad \text{(Equation 20)}$$
$$= Iw + 2(V)/25(k\Omega) \times 15$$
$$= Iw + 1200(\mu A)$$

Assuming in the second embodiment similar to the first embodiment that the bit selecting transistors TBjk which are higher in the current driving capability are located beneath the memory cell array in the memory cell array area, the transistor width of the bit line selecting transistors TBjk can be as generous as 16F which is equal to a half the side, 32F, of the memory cell array. In case of 0.13 μm process, the transistor width of the bit line selecting transistors TBjk is 2.08 μm and the current driving capability Itbs will be as high as 1400 μA.

Accordingly, the current driving capability Itbs required for the bit line selecting transistors TBjk is greater than or equal to the current Ibs2 as denoted by Inequation 21, whereby the write current Iw can be provided at 200 μA or smaller.

$$Itbs > Iw + 1200(\mu A) \quad \text{(Inequation 21)}$$

As explained, the bias mode in the second embodiment allows the third bias voltage (|Vwr−Vwc|) supplied to the unselected memory cells connected with the unselected data lines DLi (i≠2) and the unselected bit lines BLj (j≠2) to remain at 0 V, similar to that of the conventional ½ bias mode, and the unselected memory cells can stay free from the writing action or the resetting action while being supplied with no bias currents. Accordingly, while the power consumption of the entire memory cell array remains as low as of the conventional ½ bias mode, the write current supplied to the target memory cell can be provided at a higher level than that of the conventional ½ bias mode.

The resetting action of the bias mode in the second embodiment is a reverse of the writing action where the row selecting potential and the column selecting potential supplied to the selected data line DL2 and the selected bit line BL2 respectively in the writing action are exchanged with each other while the row unselecting potential and the column unselecting potential supplied to the unselected data lines DLi (i≠2) and the unselected bit lines BLj (j≠2) respectively in the writing action are exchanged with each other. As the result, the voltage applied to the target memory cell for the writing action is inverted in the polarity thus to turn to a reset voltage, hence enabling the resetting action. Since the functional relationship between the data lines DLi and the bit lines BLj is simply inverted, the advantages in the resetting action over the conventional ½ bias mode remain identical to those in the writing action and will thus be explained in no more detail.

Third Embodiment

A third embodiment of the present invention will be described. The inventive device of the third embodiment is also a cross point memory of the multi-bank type similar to that of the first or second embodiment. As the block arrangement is identical to that of the first embodiment shown in FIGS. 1 and 2, its overlapping description will be omitted. The third embodiment is differentiated from the first embodiment by an action of the bias mode for supplying each of the data lines DLi and each of the bit lines BLj in a target bank (for example, the bank BK0) with a row potential and a column potential respectively to conduct the writing action. The bias mode will now be described in more detail. It is assumed in the third embodiment similar to the first or second embodiment that the data line selecting transistors TDik are lower in the current driving capability than the bit line selecting transistors TBjk and one of the memory cells in a 16×16 array is a target memory cell to be written.

Figure 10:
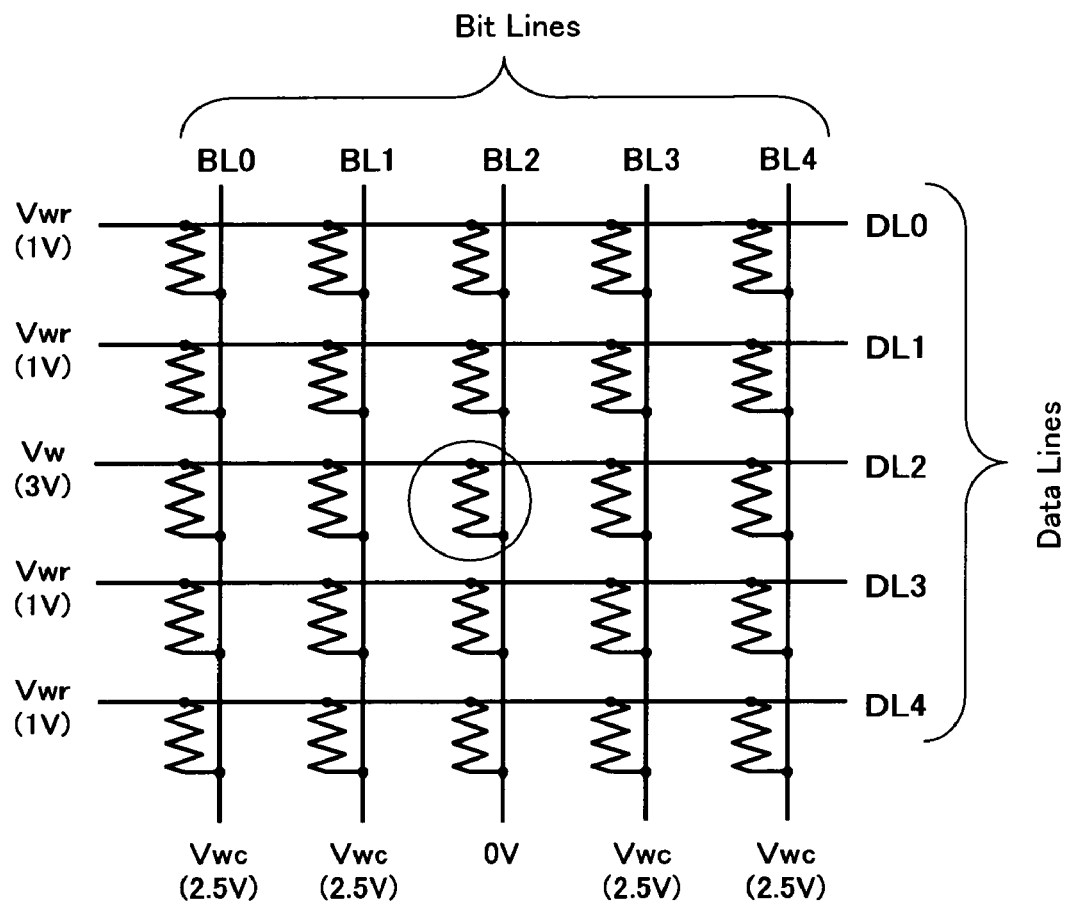
FIG. 10 is a schematic circuitry diagram of the memory cell array showing a writing action at the bias mode in the semiconductor storage device as a third embodiment of the present invention.
Figure 11:
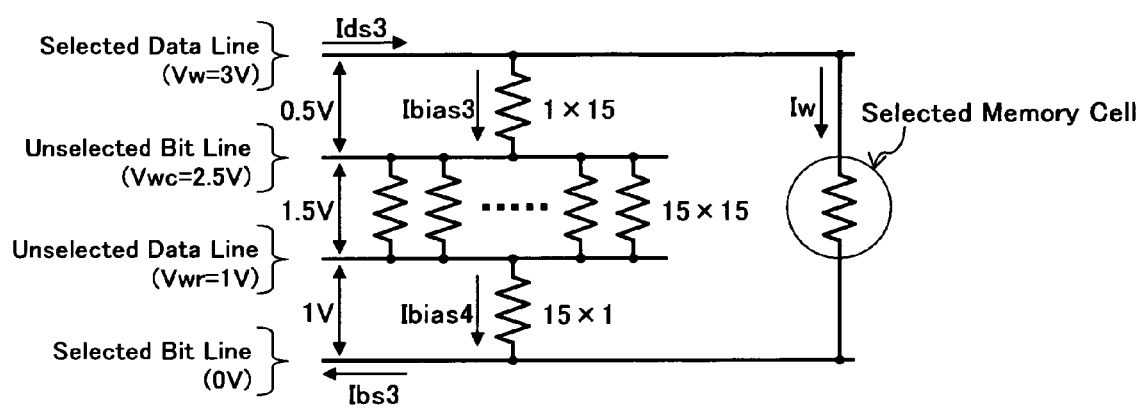
FIG. 11 is an equivalent circuitry diagram of the memory cell array which is applied with a voltage for conducting the writing action at the bias mode in the semiconductor storage device of the third embodiment of the present invention.
Figure 12:
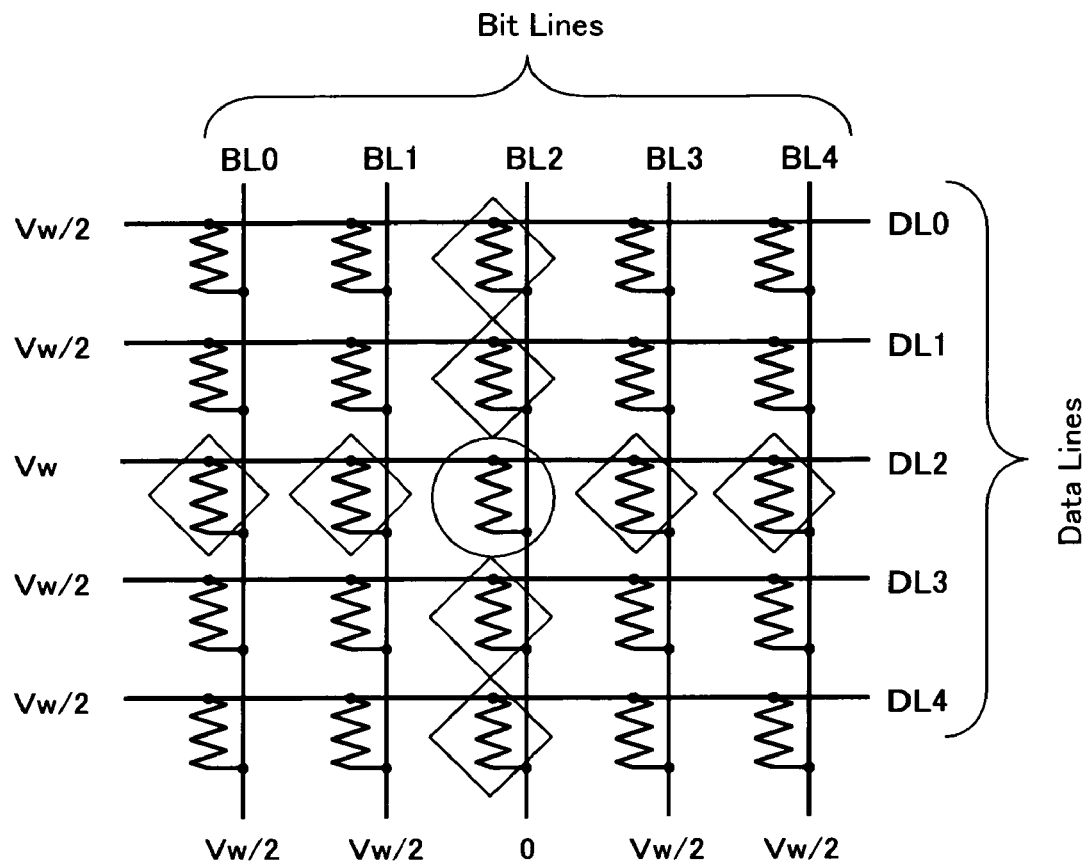
FIG. 12 is a schematic circuitry diagram of a memory cell array showing a writing action at the conventional ½ bias mode.
Figure 13:
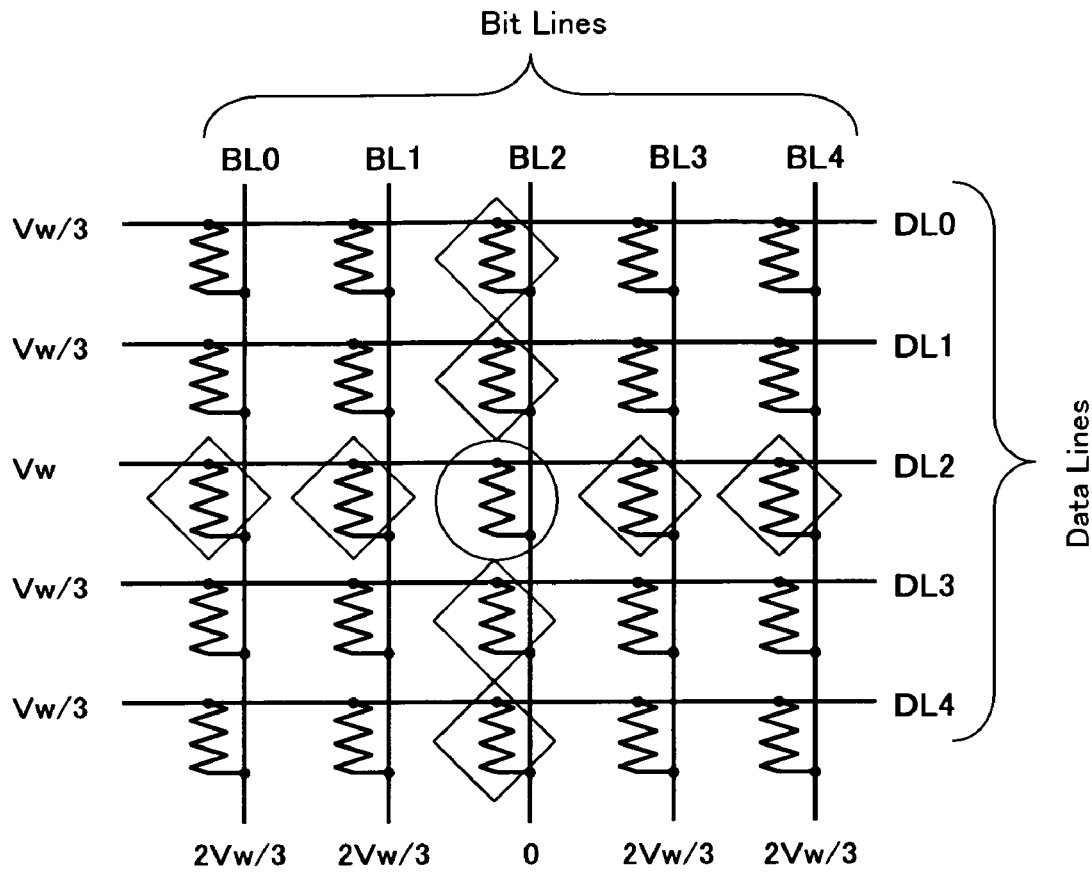
FIG. 13 is a schematic circuitry diagram of a memory cell array showing a writing action at the conventional ⅓ bias mode.
Figure 14:
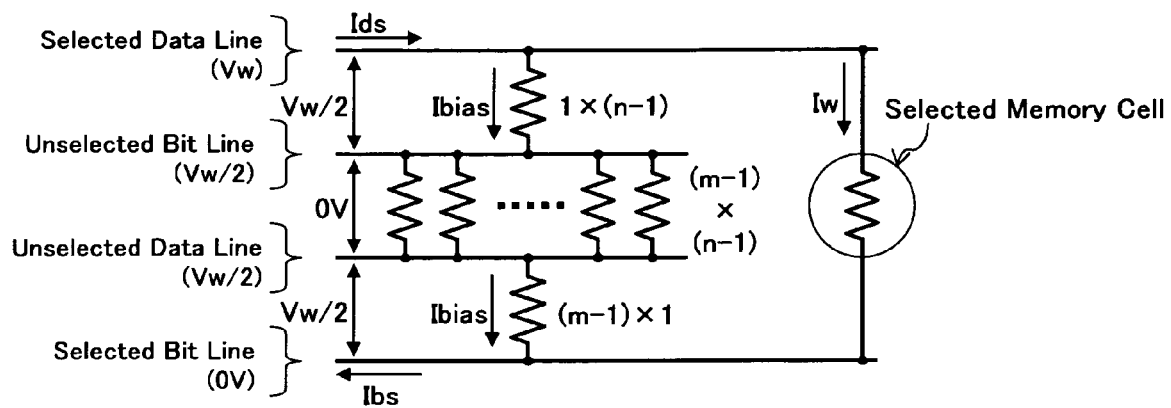
FIG. 14 is an equivalent circuitry diagram of the memory cell array which is applied with a voltage at the conventional ½ bias mode.
Figure 15:
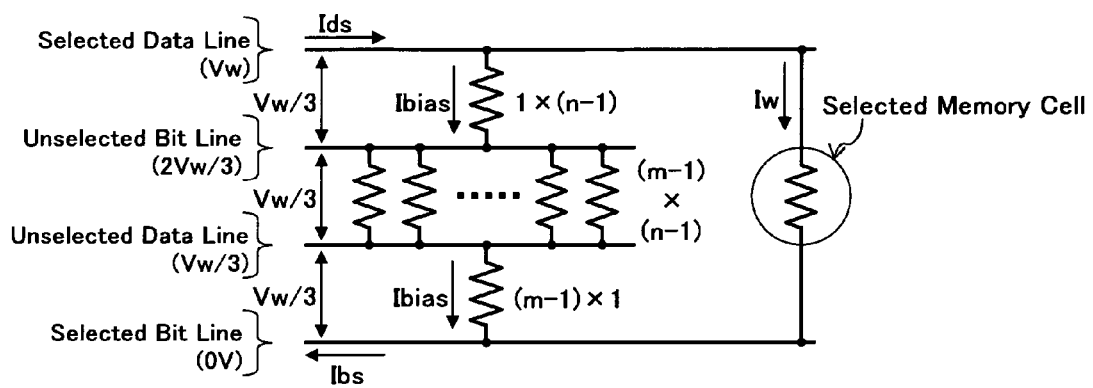
FIG. 15 is an equivalent circuitry diagram of the memory cell array which is applied with a voltage at the conventional ⅓ bias mode.

Referring to FIGS. 10 and 11, the writing action at the bias mode in the third embodiment will be described. FIG. 10 illustrates specifically a region (five rows by five columns) of the 16×16 matrix of the memory cell array where the memory cell denoted by the circle is a target cell to be written while the other memory cells remain intact. The data line DL2 and the bit line BL2 connected with the target memory cell are a selected data line and a selected bit line respectively. The other data lines DLi (i≠2) and the other bit lines BLj (j≠2) are unselected data lines and unselected bit lines. According to this embodiment, the write current is supplied from the selected data line DL2 to the target memory cell.

As shown in FIG. 10, the selected data line DL2 and the selected bit line BL2 are supplied with a row selecting potential Vw (for example, Vw=3V) and a column selecting potential (for example, 0 V) respectively thus to supply the target memory cell with the write voltage Vw (=Vw−0=3V). Simultaneously, the unselected data lines DLi (i≠2) are supplied with a row unselecting potential Vwr (for example, Vwr=1V) while the unselected bit lines BLj (j≠2) are supplied with a column unselecting potential Vwc (for example, Vwc=2.5V). FIG. 11 is an equivalent circuitry diagram showing separately the write current running across the target memory cell and the undesired bias currents running across the unselected memory cells in the memory cell array supplied with a voltage at the bias mode shown in FIG. 10.

In the writing action of this embodiment which is different from the first embodiment, when the row selecting potential Vw and the column unselecting potential Vw to be applied to the unselected memory cells connected with the selected data line DL 2 are not equal to each other, the first bias voltage (Vw−Vwc=0.5V) which is determined by the absolute value of a difference between the row selecting potential Vw and the column unselecting potential Vwc becomes lower than the first bias voltage (Vw/3=1V) of the conventional ⅓ bias mode. As the first bias voltage is lower than a level required for the writing action or the resetting action, the unselected memory cells connected with the selected data line DL2 stay free from the writing action and the resetting action. Also, the bias current Ibias3 running in the unselected memory cells connected with the selected data line DL2 becomes smaller than that of the conventional ⅓ bias mode. Meanwhile, the current Ids3 received from the selected data line DL2 is a sum of the write current Iw running in the target memory cell and a bias current Ibias3 running in the unselected memory cells as denoted by Equation 22. The bias current Ibias3 is equal to a total of bias components Ibias30 running in the unselected memory cells. However, R in Equation 22 represents a level of the resistance at the low resistance state of the unselected memory cell. When all the unselected memory cells remain at the low resistance state, the current Ids3 is a maximum.

$$Ids3 = Iw + Ibias3 \quad \text{(Equation 22)}$$
$$= Iw + Ibias30 \times 15$$
$$= Iw + (Vw - Vwc)/R \times 15$$

On the other hand, the second bias voltage which is determined by the absolute value of a difference between the column selecting potential (0 V) and the row unselecting potential (Vwr=1V) applied to the unselected memory cells connected with the selected bit line BL2 is Vwr=1V which is equal to the second bias voltage (Vw/3=1V) in the conventional ⅓ bias mode and which is too low to execute the writing action or the resetting action, thus permitting the unselected memory cells to stay out of the writing action or the resetting action. Similarly, the current Ibs3 received by the selected bit line BL2 is equal to a sum of the write current Iw running in the target memory cell and a bias current Ibias4 running in the unselected memory cells connected with the selected bit line BL2 as denoted in Equation 23. The bias current Ibias4 is equal to a total of bias components Ibias40 running in the unselected memory cells. However, R in Equation 23 represents a level of the resistance at the low resistance state of the unselected memory cell. When all the unselected memory cells remain at the low resistance state, the current Ibs3 is a maximum.

$$Ibs3 = Iw + Ibias4 \quad \text{(Equation 23)}$$
$$= Iw + Ibias40 \times 15$$
$$= Iw + Vwr/R \times 15$$

As apparent from the comparison between Equation 22 and Equation 23, the first bias voltage (Vw−Vwc=0.5V) is lower than the second bias voltage (Vwr=1V). This permits the current Ids3 received from the selected data line DL2 to be smaller than the current Ibs3 received by the selected bit line BL2. Since the data line selecting transistors TDik are lower in the current driving capability than the bit line selecting transistors TBjk, the bias mode in this embodiment will be favorable for such a particular situation.

As the bias mode of this embodiment is equal to the conventional ⅓ bias mode, the unselected memory cells connected with the unselected data lines DLi (i≠2) and the unselected bit lines BLj (j≠2) are applied with a third bias voltage (|Vwr−Vwc|) which is determined by the absolute value of a difference between the row unselecting potential Vwr and the column unselecting potential Vwc. Since the third bias voltage is not 0 V, the unselected memory cells may receive the bias current. However, when the third bias voltage (|Vwr−Vwc|) is set to a lower level than that required for the writing action or the resetting action, the writing action or the resetting action can be inhibited.

The current driving capability Itds needed for the data line selecting transistors TDik, which are lower in the current driving capability, at the bias mode of this embodiment will further be described in comparison with the conventional ⅓ bias mode, assuming that the resistance R at the low resistance state of the unselected memory cells is 25Ω, the write voltage Vw is 3 V, and each of the row unselecting potential Vwr and the column unselecting potential Vwc is 2 V in the memory cell array of 16 rows by 16 columns.

The current Ids3 received by the selected data line and denoted by Equation 22 is now expressed by Equation 24.

$$Ids3 = Iw + (Vw - Vwc)/R \times 15 \quad \text{(Equation 24)}$$
$$= Iw + 0.5(V)/25(k\Omega) \times 15$$
$$= Iw + 300(\mu A)$$

Figure 17:
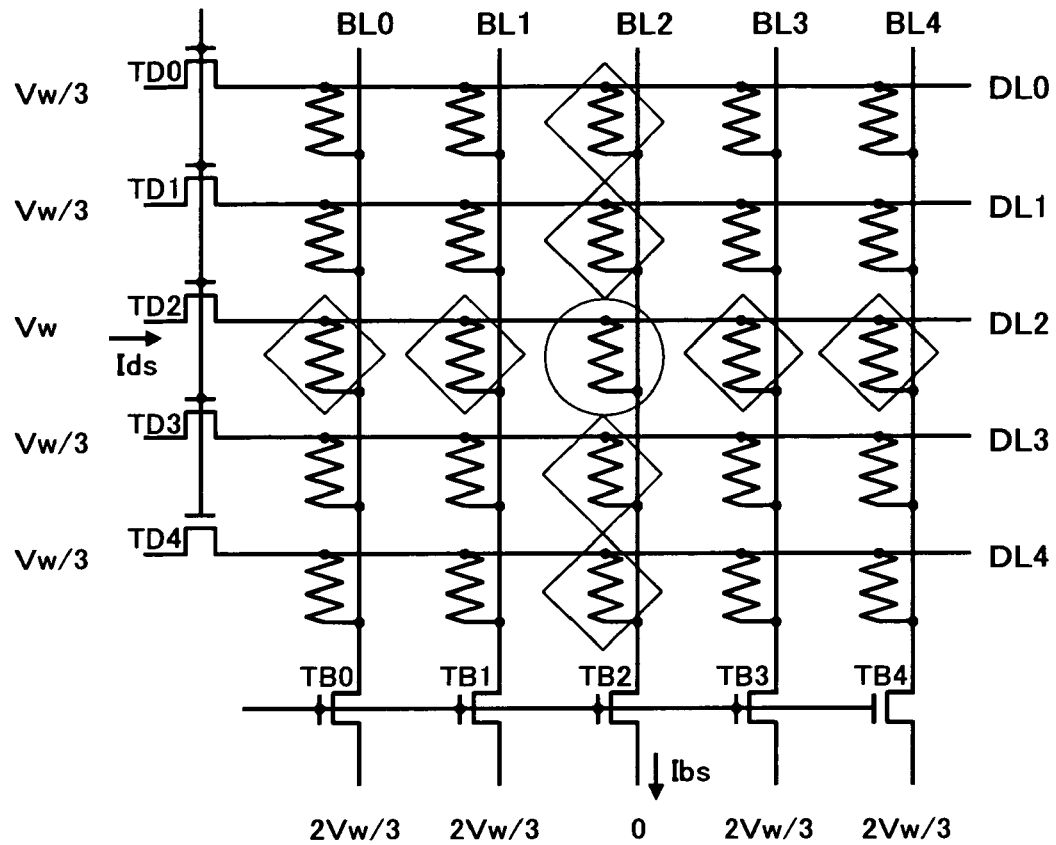
FIG. 17 is a schematic circuitry diagram of the memory cell array showing another writing action at the conventional ⅓ bias mode.

The current Ids received by the selected data line (DL2 shown in FIG. 17) at the conventional ⅓ bias mode is a sum of the write current Iw running in the target memory cell and the bias current Ibias running in the unselected memory cells connected with the selected data line as denoted in Equation 4 and Equation 5. Hence as apparent from Inequation 6, the current driving capability Itds has to be greater than or equal to the current Ids. The bias mode of the third embodiment allows the current Ids received by the selected data line (DL2 shown in FIG. 10) to be equal to a sum of the write current Iw running in the target memory cell and the bias current Ibias3 (300 μA) running in the unselected memory cells connected with the selected data line DL2 as apparent from Equation 24.

As apparent from the comparison between Equation 24 and Equation 5, the first bias voltage (Vw−Vwc=0.5V) in the third embodiment is lower than the first bias voltage (Vw/3=1V) in the conventional ⅓ bias mode. Accordingly, the current Ids3 received from the selected data line DL2 in the third embodiment is smaller than the current Ids in the conventional ⅓ bias mode, thus permitting the current driving capability for the data line selecting transistors TDik to be set with a lower level.

It is now assumed that the data line selecting transistors with their data lines are fabricated using a transistor width of 8F (F being the minimum unit in the manufacturing process). In case of 0.13 μm process, the transistor width of the data line selecting transistors is 1.04 μm creating the current driving capability of substantially 700 μA. This allows the write current Iw to be provided at 400 μA or smaller. While the conventional ⅓ bias mode enables to supply the selected data line with the write current Iw of 100 μA or smaller, the bias mode of this embodiment will be improved in the supply of the write current Iw.

Then, the current driving capability Itbs needed for the bit line selecting transistors TBjk, which is higher in the current driving capability, will be examined assuming that the resistance R at the low resistance state of the unselected memory cells is 25Ω and the write voltage Vw is 3 V in the memory cell array of 16 rows by 16 columns. The current Ibs3 received by the selected bit line BL2 and denoted by Equation 23 is now expressed by Equation 25.

$$Ibs3 = Iw + Vwr/R \times 15 \quad \text{(Equation 25)}$$
$$= Iw + 1(V)/25(k\Omega) \times 15$$
$$= Iw + 600(\mu A)$$

Assuming in the third embodiment similar to the first embodiment that the bit selecting transistors TBjk which are higher in the current driving capability are located beneath the memory cell array in the memory cell array area, the transistor width of the bit line selecting transistors TBjk can be as generous as 16F which is equal to a half the side, 32F, of the memory cell array. In case of 0.13 μm process, the transistor width of the bit line selecting transistors TBjk is 2.08 μm and the current driving capability Itbs will be as high as 1400 μA.

Accordingly, the current driving capability Itbs required for the bit line selecting transistors TBjk is greater than the current Ibs3 as denoted by Inequation 26, whereby the write current Iw can be provided at 800 μA or smaller.

$$Itbs > Iw + 600(\mu A) \quad \text{(Inequation 26)}$$

As explained, the bias mode in the third embodiment allows the third bias voltage (|Vwr−Vwc|) supplied to the unselected memory cells connected with the unselected data lines DLi (i≠2) and the unselected bit lines BLj (j≠2) to remain not at 0 V, similar to that of the conventional ⅓ bias mode, and the unselected memory cells may receive the bias current. However, the writing action or the resetting action can be inhibited. Accordingly, although the power consumption of the entire memory cell array is increased more or less by the effect of the bias current in the unselected memory cells, the write current supplied to the target memory cell can be provided at a higher level by the third bias voltage set to a higher level than that of the conventional ⅓ bias mode thus to lower the first bias voltage and increase the current driving capability Itds of the data line selecting transistors TDik which are lower in the current driving capability.

The resetting action of the bias mode in the third embodiment is a reverse of the writing action where the row selecting potential and the column selecting potential supplied to the selected data line DL2 and the selected bit line BL2 respectively in the writing action are exchanged with each other while the row unselecting potential and the column unselecting potential supplied to the unselected data lines DLi (i≠2) and the unselected bit lines BLj (j≠2) respectively in the writing action are exchanged with each other. As the result, the voltage applied to the target memory cell for the writing action is inverted in the polarity thus to turn to a reset voltage, hence enabling the resetting action. Since the functional relationship between the data lines DLi and the bit lines BLj is simply inverted, the advantages in the resetting action over the conventional ⅓ bias mode remain identical to those in the writing action and will thus be explained in no more detail.

The memory cells employed in the inventive device according to the first and second embodiments will now be described.

The memory cell may comprise any type of variable resistor element of which the electric resistance is varied to save a data, thus being not limited to a specific structure or arrangement. The storage characteristic of the memory cell is either volatile or nonvolatile. When the inventive device employs nonvolatile memories, its memory cell array can be increased in the dimensional density thus contributing to the greater storage of the nonvolatile memories.

Some examples of the memory cell will be described below. For example, a phase change memory may be used where the phase transition material such as a chalcogenide compound is shifted between crystalline phase (at low resistance) and amorphous phase (at high resistance). Also, a polymer memory or polymer ferroelectric RAM (PFRAM) may be employed where the fluorine resin material in each memory cell is shifted in the ferroelectric polarization state as its (polar conductive polymer) molecules are polarized in different directions.

The memory cell may be made of an Mn oxide material such as PCMO($Pr_{(1-X)}Ca_XMnO_3$) which has a perovskite structure providing a CMR (Colossal Magnetic Resistance) effect.

The memory cell in a memory may be made of a metal oxide including a transition metal such as Ni, Ti, Hf, or Zr of which the resistance is varied depending on a change in the electric pulse.

Alternatively, the memory cell may be made of a combination of metal oxide, such as STO($SrTiO_3$), SZO($SrZrO_3$), or SRO($SrRuO_3$), and metallic particles powder where the resistance at the interface between the two materials is varied by the application of voltage as the effect of interface phenomenon is utilized.

More generally speaking, the inventive device will be implemented by the following types of memory cell.

(1) The resistor element in the memory cell is made of a semiconductor material.

(2) The resistor element in the memory cell is made of an oxide or nitride material.

(3) The resistor element in the memory cell is made of a compound of metal and semiconductor.

(4) The resistor element in the memory cell is made of a fluorine resin material.

(5) The resistor element in the memory cell is made of an electrically conductive polymer in the form of polymer ferroelectric RAM (PFRAM).

(6) The resistor element in the memory cell is made of a chalcogenide material in the form of OUM.

(7) The resistor element in the memory cell is made of a perovskite compound which can provide a CMR effect.

(8) The resistor element in the memory cell is made of spin-dependent tunnel junction element in the form of MRAM.

Other modifications of the inventive device will now be described.

[1] The bias mode in the first embodiment is arranged in that, when the data line selecting transistors TDik are lower in the current driving capability than the bit line selecting transistors TBjk, the first bias voltage determined by the absolute value of a difference between the row selecting potential Vw and the column unselecting potential Vw applied to the unselected memory cells connected with the selected data line remains at 0 V and simultaneously the second bias voltage determined by the absolute value of a difference between the row unselecting potential (Vw/2) and the column selecting potential (0V) applied to the unselected memory cells connected with the selected bit line is set to a half the write voltage. The first bias voltage is not limited to 0 V but may be a level between 0 V and the second bias voltage (Vw/2). This declines the margin of write currents for determining the current driving capability of the data line selecting transistors TDik but its increase of the second bias voltage reduces the third bias voltage. Accordingly, the bias currents running in the many unselected memory cells connected with the unselected data and bit lines can be decreased thus minimizing the power consumption at the writing action in the entire memory cell array.

[2] The bias mode in the second embodiment is arranged in that, when the data line selecting transistors TDik are lower in the current driving capability than the bit line selecting transistors TBjk, the row unselecting potential Vwr and the column unselecting potential Vwc are set so that the first bias voltage (Vw−Vwc=1V) remains lower than the second bias voltage (Vwr=2V). However, the setting level is not limited to that of the second embodiment.

[3] The bias mode in the third embodiment is arranged in that, when the data line selecting transistors TDik are lower in the current driving capability than the bit line selecting transistors TBjk, the first bias voltage determined by the absolute value of a difference between the row selecting potential (Vw=3V) and the column unselecting potential (Vwc=2.5V) is set to Vw−Vwc=0.5V which is lower than the first bias voltage (Vw/3=1V) applied in a conventional ⅓ bias mode and simultaneously the second bias voltage (Vwr=1V) determined by the absolute value of a difference between the row selecting potential (0V) and the column unselecting potential (Vwr=1V) is set equal to the second bias voltage (Vw/3=1V) applied in the conventional ⅓ bias mode, whereby the first bias voltage is equal to the second bias voltage. However, the column unselecting potential and the row unselecting potential are not limited to Vwc=2.5V and Vwr=1V respectively of the third embodiment.

For example, when the current driving capability of the data line selecting transistors TDik has a generous margin, the column unselecting potential Vwc may be lowered to increase the first bias voltage (Vw−Vwc). Alternatively, when the current driving capability of the bit line selecting transistors TBjk has a generous margin, the row unselecting potential Vwr may be raised to increase the second bias voltage (Vwr=1V). In either case, the third bias voltage can be lowered thus attenuating the bias currents running in the many unselected memory cells connected with the unselected data and bit lines and thus minimizing the power consumption at the writing action of the entire memory cell array. Also, if the current driving capability of the bit line selecting transistors TBjk hardly has a margin, the row unselecting potential Vwr may be lowered to decrease the second bias voltage (Vwr=1V). This will increase the supply of the write current to the target memory cell.

[4] Although the write voltage Vw is set to 3 V in each of the embodiments, it may not be limited to the same.

[5] Although the data line selecting transistors TDik are lower in the current driving capability than the bit line selecting transistors TBjk according to each of the embodiments, they may be higher than the same. In the latter case, the data lines and the bit lines can be exchanged in the requirements with the same effect.

[6] Although the memory cell array in each of the embodiments consists of a matrix of 16 rows by 16 columns, they may not be limited to the same. The rows (equal to the number of data lines) and columns (equal to the number of bit lines) in the memory cell array will be arbitrarily modified in the number. Also, the number of the rows may not be identical to the number of the columns. When the rows and the columns are different from each other in the number, for example, the number of the rows is greater than the number of the columns, the number of the memory cells connected with the bit lines will increase. It is hence necessary that the current driving capability of the bit line selecting transistors TBjk is higher than the current driving capability of the data line selecting transistors TDik. In contrast, when the number of the rows is smaller than the number of the columns, the number of the memory cells connected with the data lines will increase. Accordingly, the current driving capability of the data line selecting transistors TDik has to be higher than the current driving capability of the bit line selecting transistors TBjk.

[7] Although the multi-bank construction shown in FIG. 1 comprises a matrix of two rows by two columns of banks, each bank or memory cell array consisting of the memory cells in 16 rows by 16 columns, it may not be limited to such a hierarchical arrangement of the data lines and the bit lines. The multi-bank construction may be implemented by either the rows or the columns. More specifically, either the data lines or the bit lines may be connected in a hierarchical arrangement. The matrix of the rows and the columns for developing the multi-bank construction may not be limited to two by two.

[8] Although the semiconductor manufacturing process is based on the precision of 0.13 μm for determining the gate width and the current driving capability of the bit line selecting transistors TBjk and the gate width and the current driving capability of the data line selecting transistors TDik according to each of the embodiments, it may not be limited to the same for building the inventive device.

[9] Although the group of either the data line selecting transistors TDik or the bit line selecting transistors TBjk whichever is higher in the current driving capability is placed beneath the memory cell array in the memory cell array area in each of the embodiments, its layout of either the data line selecting transistors TDik or the bit line selecting transistors TBjk may not be limited to the same described with the first embodiment. For example, a part of the group of the selecting transistors which are higher in the current driving capability may be allocated in the memory cell array area. Alternatively, a part or all of the group of the selecting transistors which are lower in the current driving capability may be allocated in the memory cell array area. Moreover, at least a part of both the data line selecting transistors TDik and the bit line selecting transistors TBjk may be allocated in the memory cell array area. Both the data line selecting transistors TDik and the bit line selecting transistors TBjk may be allocated out of the memory cell array area.

As set forth, the semiconductor storage device according to the present invention is provided comprising a cross point type of memory cell array in which a plurality of memory cells each of which includes a variable resistor element of which electric resistance is varied to store data are arranged in a row and column direction and each memory cell in the same row is connected at one end to a common data line and each memory cell in the same column is connected at the other end to a common bit line. In particular, the inventive storage device is favorable utilized as a measure for ensuring the supply of write currents to target memory cells at the writing action with the limited current driving capability of either the data line selecting transistors or the bit line selecting transistors.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor storage device comprising:
   a memory cell array in which a plurality of memory cells each of which includes a variable resistor element of which an electric resistance is varied to store data are arranged in a row and column direction, a plurality of data lines are arranged to extend in the row direction, a plurality of bit lines are arranged to extend in the column direction, and the variable resistor elements in the memory cells in the same row are connected at one end to the data line in common while the variable resistor elements in the memory cells in the same column are connected at the other end to the bit line in common, wherein
   for conducting a writing action to vary an electric resistance of the variable resistor element in the memory cell to be written by supplying a selected data line of the data lines connected to the memory cell to be written and unselected data lines of the data lines other than the selected data line with a row selecting potential and a row unselecting potential respectively through a data line selecting transistor provided for each of the data lines, and supplying a selected bit line of the bit lines connected to the memory cell to be written and unselected bit lines of the bit lines other than the selected bit line with a column selecting potential and a column unselecting potential respectively through a bit line selecting transistor provided for each of the bit lines,
   the data lines and the bit lines are separately driven so that a write voltage determined by absolute value of a difference between the row selecting potential and the column selecting potential is higher than a level required for conducting the writing action while a first bias voltage determined by absolute value of a difference between the row selecting potential and the column unselecting potential, a second bias voltage determined by absolute value of a difference between the row unselecting potential and the column selecting potential, and a third bias voltage determined by absolute value of a difference between the row unselecting potential and the column unselecting potential are lower than a level required for conducting the writing action, and the second bias voltage is set lower than the first bias voltage when the data line selecting transistors are higher in a current driving capability than the bit line selecting transistors, and the first bias voltage is set lower than the second bias voltage when the data line selecting transistors are lower in the current driving capability than the bit line selecting transistors.

2. The semiconductor storage device according to claim 1, wherein
   the data lines and the bit lines are separately driven for conducting the writing action so that the first bias voltage is equal to a half of the write voltage when the data line selecting transistors are higher in the current driving capability than the bit line selecting transistors, or the second bias voltage is equal to a half of the write voltage when the data line selecting transistors are lower in the current driving capability than the bit line selecting transistors.

3. The semiconductor storage device according to claim 1, wherein
   the data lines and the bit lines are separately driven for conducting the writing action so that the first bias voltage is equal to a third of the write voltage when the data line selecting transistors are higher in the current driving capability than the bit line selecting transistors, or the second bias voltage is equal to a third of the write voltage when the data line selecting transistors are lower in the current driving capability than the bit line selecting transistors.

4. The semiconductor storage device according to claim 1, wherein
   the data lines and the bit lines are separately driven for conducting the writing action so that the second bias voltage is equal to 0 V when the data line selecting transistors are higher in the current driving capability than the bit line selecting transistors, or the first bias voltage is equal to 0 V when the data line selecting transistors are lower in the current driving capability than the bit line selecting transistors.

5. The semiconductor storage device according to claim 1, wherein
   the data lines and the bit lines are separately driven for conducting the writing action so that both the first bias voltage and the second bias voltage are lower than the third bias voltage.

6. The semiconductor storage device according to claim 1, wherein the data lines and the bit lines are separately driven for conducting the writing action so that the third bias voltage is equal to 0 V.

7. The semiconductor storage device according to claim 1, wherein at least a part of a group of transistors including either the data line selecting transistors or the bit line selecting transistors, whichever are higher in the current driving capability, is allocated beneath the memory cell arrays in the memory cell array area.

8. The semiconductor storage device according to claim 1, wherein a plurality of the memory cell arrays are arranged at least in the row direction, a plurality of main data lines extend in the row direction corresponding to each of the data lines in the memory cell arrays arranged in the row direction for supplying predetermined row potentials, and each of the main data lines is connected through each of the data line selecting transistors to the corresponding data line in the memory cell arrays.

9. The semiconductor storage device according to claim 1, wherein a plurality of the memory cell arrays are arranged at least in the column direction, a plurality of main bit lines extend in the column direction corresponding to each of the bit lines in the memory cell arrays arranged in the column direction for supplying predetermined column potentials, and each of the main bit lines is connected through each of the bit line selecting transistors to the corresponding bit line in the memory cell arrays.

* * * * *